(12) United States Patent
Mäntysalo et al.

(10) Patent No.: US 12,566,207 B2
(45) Date of Patent: Mar. 3, 2026

(54) SENSING SYSTEMS FOR MONITORING AND MANAGING FAULTS IN ELECTRICAL UTILITY GRID

(71) Applicant: Safegrid Oy, Espoo (FI)

(72) Inventors: Tapio Mäntysalo, Hevonpää (FI); Jussi Hakunti, Parainen (FI)

(73) Assignee: Safegrid Oy, Espoo (FI)

( * ) Notice: Subject to any disclaimer, the term of this patent is extended or adjusted under 35 U.S.C. 154(b) by 412 days.

(21) Appl. No.: 18/245,433

(22) PCT Filed: Jan. 10, 2023

(86) PCT No.: PCT/FI2023/050020
§ 371 (c)(1),
(2) Date: Mar. 15, 2023

(87) PCT Pub. No.: WO2023/135364
PCT Pub. Date: Jul. 20, 2023

(65) Prior Publication Data
US 2024/0295598 A1      Sep. 5, 2024

(30) Foreign Application Priority Data

Jan. 17, 2022      (FI) ..................................... 20225035

(51) Int. Cl.
*G01R 31/08*          (2020.01)
(52) U.S. Cl.
CPC ......... *G01R 31/085* (2013.01); *G01R 31/086* (2013.01)
(58) Field of Classification Search
CPC ........................ G01R 31/2841; G01R 31/2856
(Continued)

(56) References Cited

U.S. PATENT DOCUMENTS

2009/0284249 A1      11/2009   Syracuse et al.
2010/0085036 A1      4/2010    Banting et al.
(Continued)

FOREIGN PATENT DOCUMENTS

WO          2021165574 A1      8/2021

OTHER PUBLICATIONS

European Patent Office, Notification of Transmittal of the International Search Report and the Written Opinion of the International Searching Authority, or the Declaration, Application No. PCT/FI2023/050020, Mailing date Apr. 5, 2023, 15 pages.
(Continued)

*Primary Examiner* — Huy Q Phan
*Assistant Examiner* — Trung Q Nguyen
(74) *Attorney, Agent, or Firm* — Ziegler IP Law Group, LLC.

(57) ABSTRACT

Disclosed is a sensing apparatus with a first sensor device, second sensor device, third sensor device, which sense magnetic fields to generate sensor data, and a first processor. The sensing apparatus is arranged on an electrical pole of the electrical utility grid. The second sensor device overlaps with the first sensor device to form a cross-positioned two-sensor configuration. The third sensor device is arranged at distance from it. The first processor is configured to pre-process sensor data to send to the second processor, generate and send measurement data to the second processor for reproducing overhead line phase currents, and send measurement data to the third processor which utilizes the measurement data for monitoring and managing events and faults in the electrical utility grid.

15 Claims, 13 Drawing Sheets

(58) Field of Classification Search
USPC .......................... 324/500, 600, 76.11, 762.03
See application file for complete search history.

(56) References Cited

U.S. PATENT DOCUMENTS

| 2013/0054162 | A1* | 2/2013 | Smith | .................. | G01R 15/142 |
| | | | | | 702/58 |
| 2016/0341769 | A1* | 11/2016 | Danesh | .................. | H02H 3/006 |
| 2020/0126748 | A1 | 4/2020 | Lee et al. | | |
| 2020/0259337 | A1* | 8/2020 | DeCock | ................. | G05B 17/02 |
| 2021/0247435 | A1* | 8/2021 | Haynes | .............. | G01R 19/2513 |
| 2021/0341545 | A1* | 11/2021 | Casey | ................... | G01R 29/08 |
| 2022/0206055 | A1* | 6/2022 | Verrax | ................. | G01R 31/086 |
| 2023/0327426 | A1* | 10/2023 | Pradhan | .............. | H02H 1/0092 |
| | | | | | 361/78 |

OTHER PUBLICATIONS

Ferreira, A noninvasive technique for fault detection and location, IEEE Transactions on power delivery, Oct. 2010, 3024-3034, vol. 25, No. 4.

Jesus Anicio De Oliveira Neto, Fault location in overhead transmission lines based on magnetic signatures and on the extended kalman filter, IEEE Access, Jan. 8, 2021, 15259-15270, vol. 9, Brazil.

Finnish Patent and Registration Office, Search Report, Patent Application No. 20225035, dated Aug. 22, 2022, 2 pages.

* cited by examiner

ARRANGE FIRST SENSOR DEVICE, SECOND SENSOR DEVICE, THIRD SENSOR DEVICE, AND FIRST PROCESSOR OF SENSING APPARATUS IN HOUSING SUCH THAT WHEN HOUSING IS ARRANGED ON ELECTRIC POLE, FIRST SENSOR DEVICE OVERLAPS FIRST SENSOR DEVICE TO FORM CROSS-POSITIONED TWO-SENSOR CONFIGURATION, AND THIRD SENSOR DEVICE IS ARRANGED AT DISTANCE FROM IT
802

OBTAIN INFORMATION REGARDING CONFIGURATION OF ELECTRICAL OVERHEAD LINES WITH RESPECT TO ELECTRICAL POLE
804

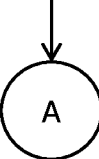

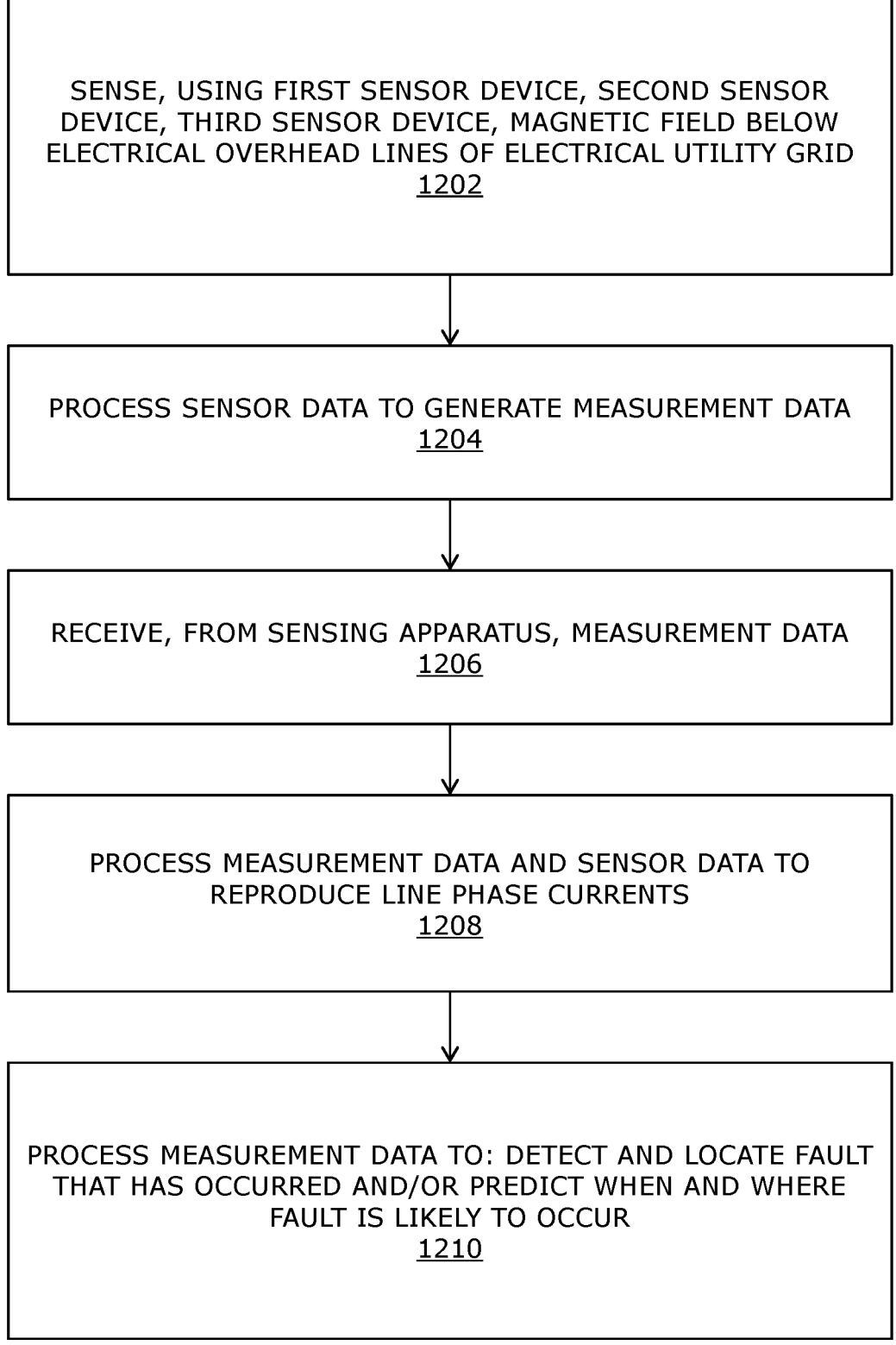

SENSE, USING FIRST SENSOR DEVICE, SECOND SENSOR DEVICE, THIRD SENSOR DEVICE, MAGNETIC FIELD BELOW ELECTRICAL OVERHEAD LINES OF ELECTRICAL UTILITY GRID
1202

PROCESS SENSOR DATA TO GENERATE MEASUREMENT DATA
1204

RECEIVE, FROM SENSING APPARATUS, MEASUREMENT DATA
1206

PROCESS MEASUREMENT DATA AND SENSOR DATA TO REPRODUCE LINE PHASE CURRENTS
1208

PROCESS MEASUREMENT DATA TO: DETECT AND LOCATE FAULT THAT HAS OCCURRED AND/OR PREDICT WHEN AND WHERE FAULT IS LIKELY TO OCCUR
1210

SENSING SYSTEMS FOR MONITORING AND MANAGING FAULTS IN ELECTRICAL UTILITY GRID

TECHNICAL FIELD

The present disclosure relates to sensing apparatuses. Moreover, the present disclosure also relates to methods for installing a sensing apparatus in an electrical utility grid. Further, the present disclosure also relates to systems for predicting, monitoring, and managing events and faults in an electrical utility grid. Furthermore, the present disclosure also relates to methods for predicting, monitoring, and managing events and faults in an electrical utility grid.

BACKGROUND

With the advent in usage of electricity worldwide, electrical utility grids were installed to transmit electricity from an electricity generating plant to various consumers, including but not limited to households, factories, hospitals, offices, and schools. Such electrical utility grids may be expansive enough to cover entire countries or continents to ensure electricity supply in each remote area, and not merely in cities. The electrical utility grids consist of expansive transmission and distribution lines or cables which carry the electricity, and in case of overhead lines, electrical poles, which are installed at frequent distances to ensure that the electrical wires hang at a predetermined and safe height. The transmission and distribution lines carry high voltages of electricity and will cause fatalities to normal life if interfered with.

However, managing and maintaining such electrical utility grids and ensuring an uninterrupted supply of electricity is quite difficult and associated with several limitations. Often, faults might happen in the electrical utility grid due to a voltage disruption, natural elements, or outside interference. In such cases, such faults may damage the electrical utility grid, and result in an interruption to electricity supply in certain areas which in turn may damage connected customers' equipment or property. In such cases, such faults may even lead to damage to life or property. Not only is it difficult to timely identify such faults, but it is also difficult to timely locate the fault to avoid damages or to predict locations for potential faults. Often, electric poles are located approximately 20 to 200 meters, and since current passes quickly through the distribution lines, it is difficult to narrow a fault location for fixing the fault. The presently available solutions utilize sensors to sense voltage and/or current in the distribution lines; however, these are neither accurate nor reliable and can be utilized for only a specific type of electrical utility grid having a specific current being transmitted through the distribution lines.

Moreover, to identify fault conditions, and to protect life, property and equipment on electrical grid fault conditions, the electrical grid is required to be equipped with several different kinds of fault protection and fault indication devices, such as disconnectors, fuses, protection relays and fault indicators which may be manually or automatically operating with or without remote data connection to the electrical grid operation centre.

For example, sensing the electrical fault status on an overhead line may require a current transformer installed over the wire. Solutions installable at secondary substation cabinets exist, as well as solutions where current transformers are attached to the high or medium voltage wires with varying solutions, typically radio transmission, to indicate line status. In addition, several attempts with variable economic success have been made to market devices and systems for detecting the line fault status from a distance of approximately 1 to 10 meters by using magnetic sensors (such as, coils, hall elements or silicon chip base MEMS sensors or Magnetoresistance (MR) sensors). Although such fault indication devices have the benefit of easy hot-installation directly to the utility pole (i.e., it does not require for the electrical power supply to be switched off for installation), but they exponentially increased involved costs since fabricating such devices, assembling them as well as installing them are extremely expensive. Therefore, such systems have a restricted use, are expensive, and/or cannot be utilized for existing electrical utility grids. Moreover, such solutions do not provide any insight on the location of faults for mitigating the same.

Therefore, in light of the foregoing discussion, there exists a need to overcome the aforementioned drawbacks associated with visibility, and specifically, identifying and locating events and faults in the electrical utility grid.

SUMMARY

The present disclosure seeks to provide a sensing apparatus. The present disclosure also seeks to provide a method for installing a sensing apparatus in an electrical utility grid. The present disclosure also seeks to provide a system for monitoring and managing events and faults in an electrical utility grid. The present disclosure also seeks to provide a method for monitoring and managing events and faults in an electrical utility grid. An aim of the present disclosure is to provide a solution that overcomes at least partially the problems encountered in prior art.

In one aspect, an embodiment of the present disclosure provides a sensing apparatus comprising:

at least a first sensor device, a second sensor device, and a third sensor device that, in operation, sense magnetic field in close proximity to electrical overhead lines of an electrical utility grid to generate sensor data, wherein at least a portion of the sensing apparatus is arranged on an electrical pole of the electrical utility grid, and wherein the second sensor device overlaps with the first sensor device to form a cross-positioned two-sensor configuration; and the third sensor device is arranged at a distance from the cross-positioned two-sensor configuration; and a first processor configured to:

pre-process the sensor data and send the sensor data to a second processor;

generate measurement data, the measurement data comprising values of magnetic field produced by electrical currents flowing through the electrical overhead lines; and send, to at least one second processor, the measurement data and the sensor data, for reproducing overhead line phase currents, wherein the second processor is configured to send, to at least one third processor, the measurement data, wherein the at least one third processor, in operation, utilizes the measurement data, for monitoring and managing currents, events and faults in the electrical utility grid.

In another aspect, an embodiment of the present disclosure provides a method for installing a sensing apparatus in an electrical utility grid, comprising:

arranging at least a first sensor device, a second sensor device, a third sensor device, and a first processor of the sensing apparatus in a housing such that when the housing is arranged on an electrical pole the second sensor device overlaps with the first sensor device to form a cross-positioned two-sensor configuration, and the third sensor device is arranged at a distance from the cross-positioned two-sensor configuration;

obtaining information regarding a configuration of electrical overhead lines with respect to the electrical pole; and arranging the sensing apparatus based on the configuration of the electrical overhead lines, such that:

the sensing apparatus is arranged horizontally with respect to the electrical pole, when the configuration of the electrical overhead lines with respect to the electrical pole is a vertical configuration;

the sensing apparatus is arranged vertically with respect to the electrical pole, when the configuration of the electrical overhead lines with respect to the electrical pole is a horizontal configuration;

the sensing apparatus is arranged to be suspended from one or more of the electrical overhead lines; or the sensing apparatus is arranged to be suspended from one or more of the electrical overhead lines, such that the sensing apparatus is powered by the electrical overhead lines.

In yet another aspect, an embodiment of the present disclosure provides a system for monitoring and managing events and faults in an electrical utility grid, the system comprising:

at least one sensing apparatus comprising:

at least a first sensor device, a second sensor device, and a third sensor device that, in operation, sense magnetic field in close proximity to electrical overhead lines of the electrical utility grid to generate sensor data, wherein at least a portion of the sensing apparatus is arranged on an electrical pole of the electrical utility grid, and wherein the second sensor device overlaps with the first sensor device to form a cross-positioned two-sensor configuration; and the third sensor device is arranged at a distance from the cross-positioned two-sensor configuration; and a first processor configured to pre-process the sensor data and send the sensor data to a second processor, generate measurement data, the measurement data comprising values of currents flowing through the electrical overhead lines;

at least one second processor communicably coupled to the first processor, wherein the at least one second processor is configured to:

receive, from the first processor, the sensor data pre-processed by the first processor, and the measurement data; and process the measurement data and the sensor data to reproduce overhead line phase currents;

at least one third processor communicably coupled to the first processor and the second processor, wherein the at least third processor is configured to:

receive, from the second processor, the measurement data;

process the measurement data to:

detect, classify and locate an event or a fault that has occurred in the electrical utility grid; and/or predict when and where an event or a fault is likely to occur in the electrical utility grid; and alert a network operator of the detected or predicted event or fault and its location.

In still another aspect, an embodiment of the present disclosure provides a method for monitoring and managing events and faults in an electrical utility grid, the method comprising:

sensing, using at least a first sensor device, a second sensor device and a third sensor device of at least one sensing apparatus, magnetic field in close proximity to electrical overhead lines of the electrical utility grid for generating sensor data;

processing the sensor data for generating measurement data, the measurement data comprising values of currents flowing through the electrical overhead lines;

receiving, from the at least one sensing apparatus, the measurement data;

processing the measurement data and the sensor data for reproducing overhead line phase currents; and processing the measurement data for:

detecting and locating an event or a fault that has occurred in the electrical utility grid; and/or predicting when and where an event or a fault is likely to occur in the electrical utility grid.

Embodiments of the present disclosure substantially eliminate or at least partially address the aforementioned problems in the prior art and enable efficient and timely identification and location of events and faults in the electrical utility grid.

Additional aspects, advantages, features, and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein:

FIG. 12 illustrates steps of a method for monitoring and managing events and faults in an electrical utility grid, in accordance with an embodiment of the present disclosure;

Figure 1:
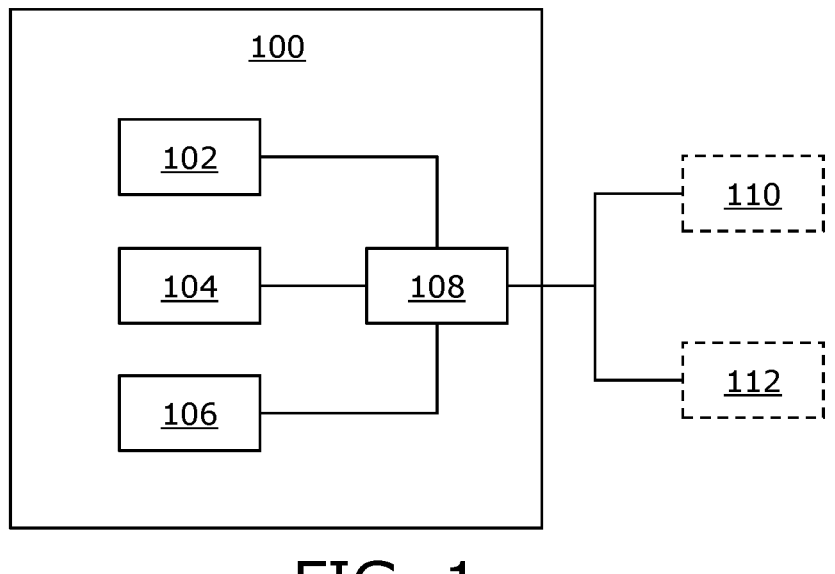
FIG. 1 illustrates a block diagram of an architecture of a sensing apparatus, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides a sensing apparatus comprising:

at least a first sensor device, a second sensor device, and a third sensor device that, in operation, sense magnetic field in close proximity to electrical overhead lines of an electrical utility grid to generate sensor data, wherein at least a portion of the sensing apparatus is arranged on an electrical pole of the electrical utility grid, and wherein the second sensor device overlaps with the first sensor device to form a cross-positioned two-sensor configuration; and the third sensor device is arranged at a distance from the cross-positioned two-sensor configuration; and a first processor configured to:

pre-process the sensor data and send the sensor data to a second processor;

generate measurement data, the measurement data comprising values of magnetic field produced by electrical currents flowing through the electrical overhead lines; and send, to at least one second processor, the measurement data and the sensor data, for reproducing overhead line phase currents, wherein the second processor is configured to send, to at least one third processor, the measurement data, wherein the at least one third processor, in operation, utilizes the measurement data, for monitoring and managing currents, events and faults in the electrical utility grid.

In another aspect, an embodiment of the present disclosure provides a method for installing a sensing apparatus in an electrical utility grid, comprising:

arranging at least a first sensor device, a second sensor device, a third sensor device, and a first processor of the sensing apparatus in a housing such that when the housing is arranged on an electrical pole the second sensor device overlaps with the first sensor device to form a cross-positioned two-sensor configuration, and the third sensor device is arranged at a distance from the cross-positioned two-sensor configuration;

obtaining information regarding a configuration of electrical overhead lines with respect to the electrical pole; and arranging the sensing apparatus based on the configuration of the electrical overhead lines, such that:

the sensing apparatus is arranged horizontally with respect to the electrical pole, when the configuration of the electrical overhead lines with respect to the electrical pole is a vertical configuration;

the sensing apparatus is arranged vertically with respect to the electrical pole, when the configuration of the electrical overhead lines with respect to the electrical pole is a horizontal configuration;

the sensing apparatus is arranged to be suspended from one or more of the electrical overhead lines; or the sensing apparatus is arranged to be suspended from one or more of the electrical overhead lines, such that the sensing apparatus is powered by the electrical overhead lines.

In yet another aspect, an embodiment of the present disclosure provides a system for monitoring and managing events and faults in an electrical utility grid, the system comprising:

at least one sensing apparatus comprising:

at least a first sensor device, a second sensor device, and a third sensor device that, in operation, sense magnetic field in close proximity to electrical overhead lines of the electrical utility grid to generate sensor data, wherein at least a portion of the sensing apparatus is arranged on an electrical pole of the electrical utility grid, and wherein the second sensor device overlaps with the first sensor device to form a cross-positioned two-sensor configuration; and the third sensor device is arranged at a distance from the cross-positioned two-sensor configuration; and a first processor configured to pre-process the sensor data and send the sensor data to a second processor, generate measurement data, the measurement data comprising values of currents flowing through the electrical overhead lines;

at least one second processor communicably coupled to the first processor, wherein the at least one second processor is configured to:

receive, from the first processor, the sensor data pre-processed by the first processor, and the measurement data; and process the measurement data and the sensor data to reproduce overhead line phase currents;

at least one third processor communicably coupled to the first processor and the second processor, wherein the at least third processor is configured to:

receive, from the second processor, the measurement data;

process the measurement data to:

detect, classify and locate an event or a fault that has occurred in the electrical utility grid; and/or predict when and where an event or a fault is likely to occur in the electrical utility grid; and alert a network operator of the detected or predicted event or fault and its location.

In still another aspect, an embodiment of the present disclosure provides a method for monitoring and managing events and faults in an electrical utility grid, the method comprising:

sensing, using at least a first sensor device, a second sensor device and a third sensor device of at least one sensing apparatus, magnetic field in close proximity to electrical overhead lines of the electrical utility grid for generating sensor data;

processing the sensor data for generating measurement data, the measurement data comprising values of currents flowing through the electrical overhead lines;

receiving, from the at least one sensing apparatus, the measurement data;

processing the measurement data and the sensor data for reproducing overhead line phase currents; and processing the measurement data for:

detecting and locating an event or a fault that has occurred in the electrical utility grid; and/or predicting when and where an event or a fault is likely to occur in the electrical utility grid.

The present disclosure provides the aforementioned sensing apparatus, the aforementioned method for installing the sensing apparatus in the electrical utility grid, the aforementioned system for monitoring and managing events and faults in the electrical utility grid, and the aforementioned method for monitoring and managing events and faults in the electrical utility grid. Herein, sensing apparatuses are installed at electrical poles of the electrical utility grid. These sensing apparatuses sense current (i.e., electric current) flowing through the electrical overhead lines and generate the measurement data to detect events and faults in the electrical utility grid. Sensor devices comprised in the sensing apparatus have the cross-positioned two-sensor configuration which improves measurement accuracy, measurement quality, and provides a compact electronic device. Processors of the system utilize the measurement data to not only detect and locate events and faults occurring in the electrical utility grid, but also to predict events and faults that are likely to occur in the future. The sensing apparatuses allow increased visibility into the electrical utility grid and assists in timely detecting and locating events and faults. This considerably reduces costs, time requirements, and ensures that uninterrupted flow of electricity is maintained.

Throughout the present disclosure, the term "sensing apparatus" refers to an apparatus which senses presence and magnitude of a magnetic field in its vicinity. The sensing apparatus comprises a plurality of sensor devices, namely—the first sensor device, the second sensor device, and the third sensor device, such that sensor data generated from the plurality of sensor devices includes sensor data for magnetic field in each dimension. Optionally, the sensing apparatus also comprises at least one additional sensor device (such as a fourth sensor device, a fifth sensor device, and so on).

Throughout the present disclosure, the term "sensor device" refers to a device which senses presence and magnitude of a magnetic field in a given plane. Moreover, the sensor device generates the sensor data based on the sensed presence and magnitude of the magnetic field. The electrical overhead lines refer to one or more uninsulated electrical cables suspended by the electric pole, for electric power transmission and distribution to transmit electrical energy across large distances. The electrical overhead lines transmit electricity of high voltages, which when interacted with, may cause damage. Optionally, the electrical overhead lines are made of a plurality of wires of conducting material wrapped in a non-conductive and non-corrosive material. For example, a plurality metal wires wrapped in plastic. Moreover, each electrical overhead line comprises a plurality of wires. Herein, the wires are together to form the electrical overhead line. In an example, the electrical overhead line may have three wires. The electrical pole is a column used to support the electrical overhead lines, such that the electrical overhead lines are suspended in air using the electrical pole(/s), at a predefined distance from the ground, such that the electrical overhead lines do not cause damage to life or property. Optionally, the electrical pole is made of at least one of: cement, wood, metals, resin.

Optionally, a given sensor device comprises:

a magnetic field sensor; and a measurement apparatus arranged in a circuit including the magnetic field sensor, wherein the measurement apparatus, in operation, measures an induced current in the circuit, the sensor data comprising values of the induced current in the circuit, wherein when processing the sensor data to generate the measurement data, the first processor is configured to:

determine values of magnetic field densities produced by electrical current in the electrical overhead lines; and determine the values of currents flowing through the electrical overhead lines, based on the values of the magnetic field densities measured by the sensors and the directivity and orientation of the sensors and distance and position of the electrical overhead lines from the sensors.

Herein, the magnetic field sensor refers to a sensor capable of sensing a magnetic field. Optionally, the magnetic field sensor detects an electromechanical field. Moreover, the measurement apparatus refers to an apparatus which measures a value of the magnetic field sensed by the magnetic field sensor, by way of measuring an induced current in the circuit. In operation, the magnetic field sensor senses a magnetic field, which is measured by the measurement apparatus. Induced current refers to current being induced in the circuit, due to the magnetic field caused by the voltage transmitting through the electrical overhead lines. Optionally, the sensor device further comprises an anti-disturbance filter, an amplifier, a digitizer, an optical transmitter and/or a radio transmitter. Beneficially, this helps to reduce disturbances in measuring the magnetic field.

Throughout the present disclosure, the term "processor" refers to hardware, software, firmware, or a combination of these configured to control operation of the aforementioned sensing apparatus or system. In this regard, the processor performs several complex data processing tasks. The processor is communicably coupled to the sensing apparatus wirelessly and/or in a wired manner. In an example, the processor may be implemented as a programmable digital signal processor (DSP). In another example, the processor may be implemented via a cloud server that provides a cloud computing service.

In some implementations, the processor is integrated with the sensing apparatus. In such implementations, the processor is physically coupled to the sensing apparatus (for example, attached via mechanical and electrical connections). In other implementations, the processor is implemented separate from the sensing apparatus.

Optionally, the processor is communicably coupled to a data repository. It will be appreciated that processing data are stored at the data repository. The data repository is optionally implemented as a memory. The memory may be local memory that is integrated with the processor, may be an external memory, may be a cloud-based memory, or similar.

Figure 6:
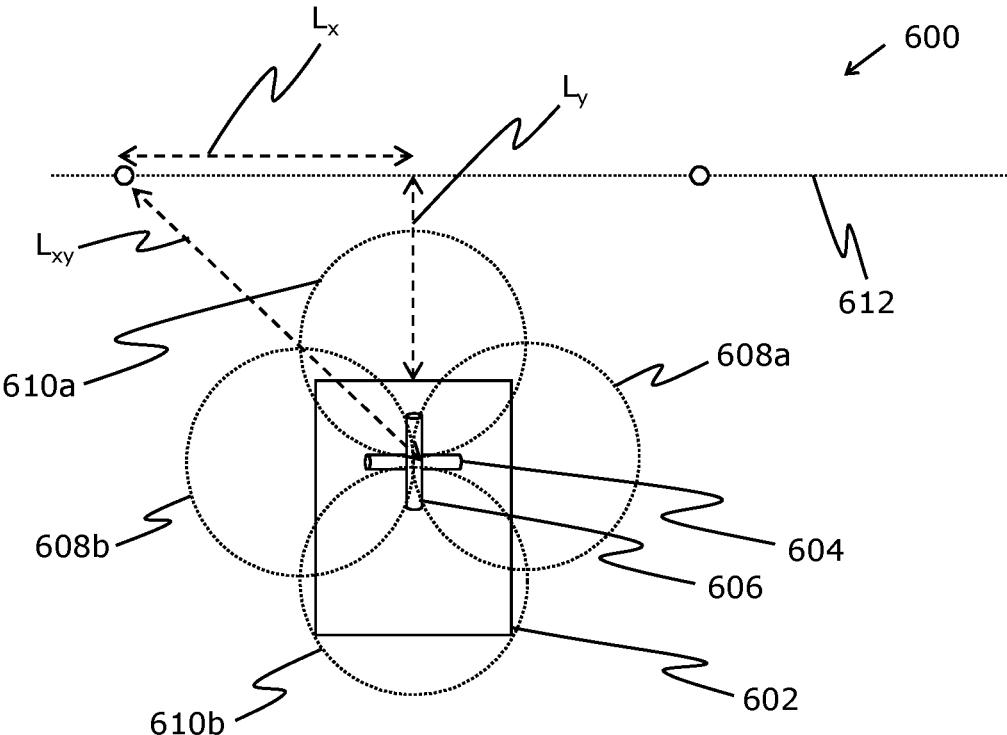
FIG. 6 is an exemplary illustration of a measurement configuration of a sensing apparatus, in accordance with an embodiment of the present disclosure.

The term "magnetic field density" refers to the amount of magnetic force induced in the circuit due to the magnetisation caused by current being transmitted through the electrical overhead lines. It will be appreciated that the magnetic field density of a given electrical overhead line is utilised to determine the value of current flowing through the given electrical overhead line. Optionally, the value of current flowing through the given electrical overhead line is determined using formulae. Referring to FIG. 6, a distance of the sensing apparatus from the electrical overhead line on the x axis is $L_x$, a distance of the sensing apparatus from the electrical overhead line on the y axis is $L_y$, and the approximate distance of the sensing apparatus from the electrical overhead line is $L_{xy}$.

Sensor signals of a given sensor device are mathematically represented
as $Hm=\Sigma I_n * D_{m,n}/L_{m,n}$.

$$\begin{pmatrix} H_x \\ H_y \\ H_z \end{pmatrix} = \begin{pmatrix} A_{xa} & A_{xb} & A_{xc} \\ A_{ya} & A_{yb} & A_{yc} \\ A_{za} & A_{zb} & A_{zc} \end{pmatrix} \begin{pmatrix} I_a \\ I_b \\ I_c \end{pmatrix}$$

such that, $A_{mn}=D_{mn}/L_n$.
wherein:
H=magnetic field detected
m=given sensor device
n=index number of a wire of the electrical overhead line
I=current in the wire of the electrical overhead line
D=directional gain of the sensor device to the wire of the electrical overhead line; and
L=distance between the sensor device and the wire of the electrical overhead line.

The line currents of each three wires of the electrical overhead line can be calculated using the matrix equation above, when D and L of each wire/sensor pair are known. A technical effect of this is that the use of magnetic field sensors avoids direct connection of the sensing apparatus with the electrical overhead lines, which, in turn, makes the sensing apparatus economical, as well as allows the system to be utilised with pre-existing electrical utility grids as well. Moreover, the sensing apparatus can be hot-installed (i.e., installed without turning the system off) behind safety distance, and also there are no cost for safety insulation between the mid- or high-voltage line and the sensing apparatus.

Optionally, the magnetic field sensor is implemented as a coil wound around a ferrite core, wherein the coil is made of a conducting material. Optionally, the conducting material is implemented as at least one of: copper, gold, silver, aluminium. Herein, the term "ferrite" refers to a ceramic material made by iron (III) oxide and at least one additional metallic element. Optionally, the additional metallic element is implemented as at least one of: strontium, barium, manganese, nickel, zinc. It will be appreciated that the ceramic material is ferrimagnetic, meaning thereby, that the ferrite core is magnetizable and/or be attracted to a magnet. Optionally, the ferrite core is made by heating the ceramic material and moulding it into a cylindrical shape. Optionally, the coil is made by stretching bits of the conducting material to form a wire. Optionally, a resonant frequency of the coil is higher than a Nyquist frequency of an input sampling frequency of an analog front end of the electrical utility grid. A technical effect of this is that this configuration guarantees high gain in high frequencies, which in turn is beneficial for accurate detection of the current transient.

Alternatively, optionally, the magnetic field sensor is implemented as an air-core coil. The term "air-core coil" refers to a coil wound around a non-magnetic core. Optionally, the air-core coil may be wound around a plastic, a ceramic, a glass, a chunk of fabric, a piece of wood, or even air. A technical advantage of this is that it is cheaper, is free from iron losses, resulting in less distortion.

Yet alternatively, optionally, the magnetic field sensor is implemented as a hall-effect sensor. The term "hall-effect sensor" refers to a sensor which detects the presence and magnitude of a magnetic field using the Hall effect. In operation, the hall-effect sensor distinguishes between the positive and negative charge moving in opposite direction. Moreover, a magnetic field detected by the hall-effect sensor is converted to suitable analog or digital signals which can be read by the measurement device. Optionally, the hall-effect sensor is made using at least one of: gallium arsenide (GaAs), indium arsenide (InAs), indium phosphide (InP), indium antimonide (InSb), graphene. A technical advantage of this is that hall-effect sensors have reduced wear and tear due to absence of moving parts, which substantially reduces the maintenance costs.

Still alternatively, optionally, the magnetic field sensor is implemented as a metal core sensor. The term "metal core sensor" refers to a magnetic field sensor having a metallic core and wound with fibre or ceramic coil. Optionally, the metal core sensor is an iron core sensor. A technical advantage of this is faster travel speeds and higher deposition rates, resulting in increased efficiency and reduced costs.

Optionally, the magnetic field sensor is protected from the magnetic field emitted by the electrical overhead lines by a shield (or, cover, made of a high-permeability material) wherein an impact of low-voltage currents on the measurements of the overhead line currents is minimized. Optionally, a radiation pattern of the magnetic field sensor is adjusted to minimize impact on the shield by at least one of: the first processor, the second processor. Optionally, the sensing apparatus is arranged close to the electrical overhead lines to be measured. Optionally, the sensing apparatus is fixed on the electrical pole. Alternatively, optionally, the sensing apparatus is fixed on a pole in proximity to the electrical pole. Advantageously, the sensing apparatus is arranged on the electrical pole to provide security from thieves, as well as a secure installation location to avoid damage or disruption caused by natural elements including wind, rain, and the like. The cross-positioned two-sensor configuration is caused by the second sensor device overlapping with the first sensor device. Optionally, the cross-positioned configuration is such that the first sensor device is arranged horizontally, and the second sensor device is arranged vertically to a reference plane. Alternatively, optionally, the cross-positioned configuration is such that the first sensor device is arranged vertically, and the second sensor device is arranged horizontally to a reference plane. In such a configuration, magnetic fields of the crossed devices are not directly overlapping, allowing the sensor devices to detect electrical overhead line events and faults more accurately by gathering sensor data more efficiently. Moreover, the cross-positioned two-sensor configuration may be rotated in any direction, including but not limited to, north, north-east, north-west, east, west, south, south-east or south-west. Alternatively, optionally, the cross-positioned configuration is such that the first sensor device overlaps the second sensor device at an angle. Herein, the angle lies in a range of 15-75 degrees.

The third sensor device is arranged at the distance from the cross-positioned two-sensor configuration, such that more sensor data is recorded from different variations of the arrangement of the sensor devices.

A technical benefit of this is to improve measurement accuracy, measurement quality, and to provide a compact electronic device, due to crossed devices.

Optionally, the electrical overhead lines are configured with respect to the electrical pole in:

a horizontal arrangement;

a vertical arrangement;

a triangle arrangement; or two alike circuits on top of each other.

Figures 3A, 3B, 4A, 4B:
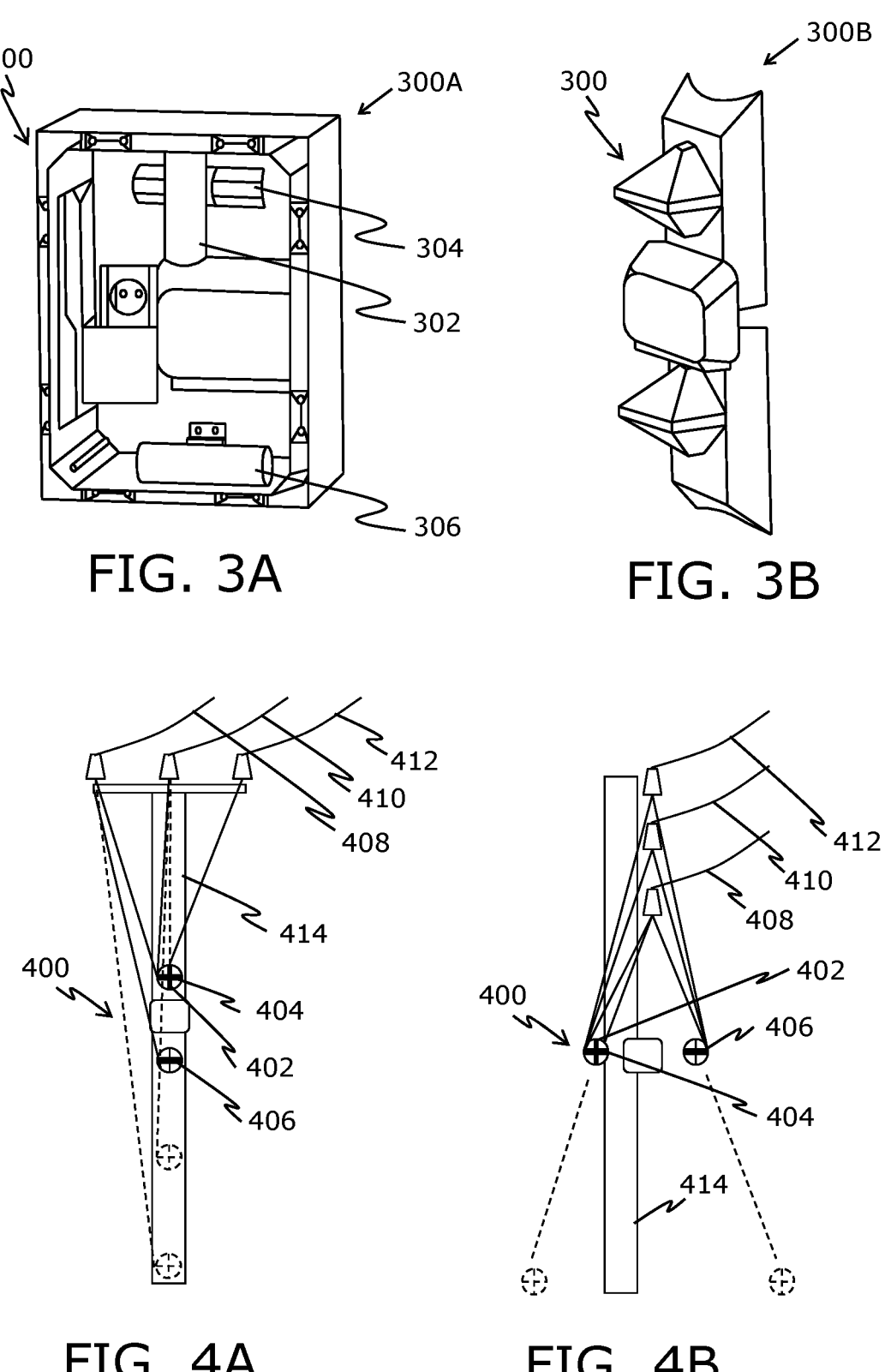
FIGS. 3A and 3B are exemplary schematic illustrations of a housing of a sensing apparatus, in accordance with different embodiments of the present disclosure.
FIGS. 4A and 4B illustrate arrangements of a sensing apparatus with respect to an electrical pole, in accordance with different embodiments of the present disclosure.

An exemplary illustration of the horizontal configuration of the electrical overhead lines with respect to the electrical pole is shown in FIG. 4A. Moreover, an exemplary illustration of the vertical configuration of the electrical overhead lines with respect to the electrical pole is shown in FIG. 4B.

Optionally, when the electrical overhead lines are configured in the triangle arrangement, two electrical overhead lines are arranged horizontally, and one electrical overhead line is arranged vertically with respect to the two electrical overhead lines. Herein, when seen from a side perspective, the electric overhead lines appear to form a triangle.

Optionally, when the electrical overhead lines are configured as two alike circuits on top of each other, the conductors from the same feeder transmit electricity in same direction. For example, when the electrical overhead lines are configured as two horizontally circuits on top of each other, the conductors from the same feeder transmit electricity in same direction. A technical advantage of this is that the ambiguity of the signals from two or more circuits are resolved at the correlation phase when the non-correlating signal (which does not match topologically to the sensing apparatus) are simply ignored as they do not correlate.

Optionally, the arrangement of the sensing apparatus depends on a configuration of the electrical overhead lines with respect to the electrical pole, such that:

when the configuration of the electrical overhead lines with respect to the electrical pole is a horizontal configuration, the sensing apparatus is arranged vertically with respect to the electrical pole; and when the configuration of the electrical overhead lines with respect to the electrical pole is a vertical configuration, the sensing apparatus is arranged horizontally with respect to the electrical pole, and/or shifted horizontally from the electrical pole.

Herein, the sensing apparatus is shifted horizontally with respect to a centre of the pole when the configuration of the electrical overhead lines with respect to the electrical pole is a vertical configuration or is not symmetrical with regard to the pole. Optionally, the sensing apparatus is installed using a mechanical support arrangement. Optionally, the sensing apparatus is arranged vertically with respect to the electrical pole, and when the configuration of the electrical overhead lines with respect to the electrical pole is a vertical configuration, the sensing apparatus is shifted horizontally with respect to the electrical pole. Beneficially, such a horizontal shift allows the sensor devices to measure the magnetic field with improved angular separation. A technical benefit of arranging the sensing apparatus based on the configuration of the electrical overhead lines with respect to the electrical pole is that the sensor devices are able to detect events of the electrical overhead lines with improved precision, when they are arranged in this manner based on the configuration of the electrical overhead lines. In operation, the sensing apparatus is arranged in proximity to the electrical overhead lines. A technical advantage of this is that it provides angular separation between the electrical overhead lines so that current in the electrical overhead lines can be distinguished from each other. Another technical advantage of this is that it provides higher magnetic fields which result in a better signal/noise ratio as compared to when the sensing apparatus is arranged at a distance from the electrical overhead lines, when current in the electrical overhead lines is low.

Alternatively, optionally, the sensing apparatus is arranged to be suspended from one or more of the electrical overhead lines. Optionally, the sensing apparatus is suspended from the one or more electrical overhead lines using a suspension tool. Optionally, the suspension tool is implemented as at least one of: a piece of wire, a ribbon, a cloth, a piece of plastic, a hook, an adhesive, a wire. A technical benefit of suspending the sensing apparatus from the electrical overhead lines is that the sensor devices of the sensing apparatus remain in close proximity to the electrical overhead lines, such that the sensing apparatus efficiently senses the magnetic field induced by the current in the electrical overhead lines.

Optionally, the sensing apparatus is powered by the electrical overhead lines. Herein, the sensing apparatus is connected to the electrical overhead lines in a galvanic manner, such that electricity is supplied to the sensing apparatus for functioning by the electrical overhead lines. A technical advantage of this is that additional sources of energy would not be required to power the sensing apparatus, and hence maintenance costs would be drastically reduced. Alternatively, optionally, the sensing apparatus is powered using a solar panel. Yet alternatively, optionally, the sensing apparatus is powered using batteries. Alternatively, the sensing apparatus is powered from nearby low-voltage electrical overhead lines.

Optionally, a shortest distance between the sensing apparatus and the electrical overhead lines lies in a range of 500 millimetres-2000 millimetres for distribution networks. The term "shortest distance" refers to the distance between a given electrical overhead line and the closest sensor device of the sensing apparatus. Herein, the sensing apparatus is optionally installed in proximity to the electrical overhead lines. However, often a distance is required to be maintained between the sensing apparatus and the electrical overhead lines, for better functionality of the sensing apparatus and for safety reasons. A technical benefit of this is that the shortest distance allows enough space between the sensing apparatus and the electrical overhead lines, that the sensor devices can accurately gather sensor data for generating precise measurement data. Distribution network refers to a portion of the electrical utility grid which transmits electricity from substations to a consumer. For example, the shortest distance may be from 500, 520, 540, 570, 1000 or 1500 millimetres up to 570, 1000, 1300, 1600, 1900 or 2000 millimetres.

Alternatively, optionally, a shortest distance between the sensing apparatus and the electrical overhead lines lies in a range of 1000 millimetres-10000 millimetres for transmission networks. More optionally, the shortest distance between the sensing apparatus and the electrical overhead lines is over 1000 mm for higher voltage transmission networks. Transmission network refers to a portion of the electrical utility grid transmitting bulk electricity from a generation site over long distances to substations. For example, the shortest distance may be from 1000, 1200, 1300, 1500, 1700, 2100, 2500, 3000, 4000 or 5000 millimetres up to 2500, 3000, 4000, 6000, 8000 or 10000 millimetres.

Optionally, the sensing apparatus is enclosed in a housing, and wherein the housing is implemented as one of: an integrated housing, a distributed housing. Housing is utilised as a protective layer for safeguarding components of the sensing apparatus from excessive wear and tear caused by natural elements, and/or damage. Moreover, the integrated housing refers to when all components of the sensing apparatus are installed in the same housing, and the distributed housing is when components of the sensing apparatus are divided in two or more separate housings. For example, if the sensing apparatus is enclosed in the distributed housing, the first sensor device, the second sensor device and the third sensor device may be arranged in a first housing and the first processor may be arranged in a second housing. A technical advantage of this is that it allows the sensing apparatus to be installed in any of the two housings, depending on the space and weather conditions, and the electrical overhead line configuration at a given location of installation.

Optionally, when the housing is the distributed housing, the first sensor device, the second sensor device and the third sensor device are arranged in proximity to the electrical pole. Depending on the configuration of the electrical overhead line configuration, the configuration of the sensing device may either be vertical or horizontal. A vertical configuration for the distributed housing of the sensing apparatus is shown in FIG. 4A, such that the third sensor device is arranged vertically to the cross-positioned two-sensor configuration. Optionally, when the sensing apparatus is arranged horizontally with respect to the electrical pole, the sensing apparatus may be housed in the distributed housing and installed around the electrical pole at the predetermined height. Moreover, a horizontal configuration for the distributed housing of the sensing apparatus is shown in FIG. 4B. As shown, the sensor devices are arranged near a base of the electrical pole. Optionally, if the sensing apparatus comprises additional sensor devices (such as a fourth sensor device, a fifth sensor device, and so on), the additional sensor devices are also placed in proximity to the pole.

Optionally, the second processor and the third processor are comprised in the sensing apparatus. Herein, in some cases, the second processor and the third processor are physically installed in the housing of the sensing apparatus. In other cases, the second processor and the third processor are remotely installed and are communicably coupled to the first processor in a wired or wireless manner.

Alternatively, optionally, the second processor and the third processor are comprised in the system for monitoring and managing events and faults in an electrical utility grid. Herein, the second processor and the third processor are installed at a location of the system. Optionally, the second processor and the third processor are installed at a server of the system. Optionally, the second processor and the third processor act as servers for the system.

The term "overhead line phase current" refers to current flowing through one phase of the electrical overhead lines. For example, for 3-phase current transmission, the overhead line phase current is calculated to be three square-root of the current flowing through the electrical overhead line. The measured value of the current flowing through the electrical overhead lines are utilised for calculating the overhead line phase current. It will be appreciated that reproducing the overhead line phase current assists in locating the event or fault in the electrical utility grid. Furthermore, it will be appreciated that reproducing the overhead line phase current assists in identifying current transients and locating the event or fault in the electrical utility grid.

Moreover, the measurement data and the sensor data are examined to identify events and faults in the electrical utility grid. Optionally, the measurement data and the sensor data are examined using a data processing algorithm. Herein, the data processing algorithm identifies events and faults by finding the current transients in the measurement data.

Optionally, the sensing apparatus further comprises a fourth sensor device, wherein the fourth sensor device is arranged to overlap the third sensor device to form another cross-positioned two-sensor configuration and arranged at the distance from the cross-positioned two-sensor configuration. Notably, often the electrical overhead lines have four lines, of which one is a ground wire, while the other three carry phase currents. Beneficially, in such cases, the fourth sensor device measures a current flowing through the ground wire. A technical advantage of the fourth sensor device is that it enables precise measurement of the current by providing values of the current flowing through the ground wire. Optionally, a current transformer is utilized with the fourth sensor device to measure the current flowing through the ground wire.

Optionally, the sensing apparatus further comprises a geolocation device, wherein the geolocation device provides location information of the sensing apparatus and timing information of the measurement data of the sensing apparatus. The term "geolocation device" refers to a device which utilises location technology to provide location data of the sensing apparatus. Optionally, the geolocation device utilises a satellite-based radionavigation system. Moreover, when the sensing apparatus processes the measurement data, the geolocation device tags the measurement data with the location information and the timing information. Optionally, the measurement data further comprises the location information and the timing information. The location information is advantageous in locating events and faults in the electric utility grid, and the timing information assists in timely tracking the events and faults in the electric utility grid by comparing the location information and timing information with a current propagation speed (i.e., an electrical current propagation speed) in the electrical overhead lines. The present disclosure also relates to the method for installing a sensing apparatus in an electrical utility grid as described above. Various embodiments and variants disclosed above, with respect to the aforementioned first aspect, apply mutatis mutandis to the method.

Optionally, the information regarding the configuration of electrical overhead lines is at least one of:

pre-known, such that it is obtained from a data repository communicably coupled to the sensing apparatus;

obtained by conducting a survey of the electrical overhead lines.

Optionally, the pre-known information is collected by at least one of: a survey conducted in the past, a survey conducted while installing, images of the configuration of electrical overhead lines, satellite data collected pertaining to the configuration of electrical overhead lines. Optionally, the data repository is installed at the server of the system. Alternatively, optionally, the data repository is located remotely and is communicably coupled in a wired or wireless manner with the sensing apparatus.

Moreover, the survey of the electrical overhead lines is conducted in at least one of: a manual manner, a digital manner. The manual survey requires a person to travel to a given location of the electrical utility grid to gather the information regarding the configuration of electrical overhead lines. For example, the information regarding the configuration of electrical overhead lines may be manually surveyed when an installation team installed the sensing apparatus by using a measure, a photograph, or from line cross-arm manufacturer specifications. The digital survey allows persons living in a vicinity or travelling by the given location of the electrical utility grid to provide the information regarding the configuration of electrical overhead lines. Optionally, a computer is utilized to conduct the digital survey of the electrical overhead lines. For example, the information regarding the configuration of electrical overhead lines may be digitally surveyed by the computer using photographs available on internet.

The present disclosure also relates to the system for monitoring and managing events and faults in an electrical utility grid as described above. Various embodiments and variants disclosed above, with respect to the aforementioned first aspect and second aspect, apply mutatis mutandis to the system.

Optionally, the sensing apparatus further comprises a geolocation device, wherein the geolocation device provides location information of the sensing apparatus and timing information of the measurement data.

Optionally, the at least one third processor alerts the network operator by sending a notification pertaining to the detected or predicted event or fault and its location to the network operator. Optionally, the at least one third processor is further configured to send the notification at a device associated with the network operator. Optionally, the network operator is at least one of: a person, a vehicle, a robot, a maintenance drone, a company.

Optionally, when processing the measurement data, the at least one third processor is configured to:

detect a current transient, based on the measurement data, wherein the current transient indicates that the event or fault has occurred in the electrical utility grid;

determine a first location and a first time instant at which the current transient occurs, based on the location information and the timing information, respectively; and determine a second location of the current transient at a second time instant, based on at least on the first location, the first time instant, and a pre-known current propagation speed in the electrical overhead lines, wherein the second time instant is later than the first time instant.

Optionally, the current transient is detected by utilising detection algorithms. The current transient is noticeable as a sudden spike or plummet in the measurement data. Optionally, the current transient is detected by utilising data processing algorithms trained to identify the current transient by analysing the measurement data. It will be appreciated that the measurement data generated by each sensing apparatus is stamped with the location and timing information, such that checking the location information and the timing information at which the current transient occurs provides the first location and the first time instant (i.e., a first time stamp). Moreover, the current propagation speed and a current propagation direction is utilised to predict the second location of the current transient. Measurement data generated by a sensing apparatus at the second location is studied to determine the presence of the current transient. Since the current transient occurs at the second location after occurring at the first location, the second time instant is later than the first time instant. A technical effect of this is the timely detection of the event or fault, along with determining where and when the event or fault can be fixed (the second location, the second time instant). This determination of the second processor saves time and minimises requirement of manual intervention, which in turn prevents complete grid failure by timely addressing events and faults.

Optionally, prior to processing the measurement data, the at least one second processor is further configured to derive characteristics of waveforms of current transients in different feeder networks by modelling dynamics of the different feeder networks, and wherein the current transient is detected when characteristics of samples in the measurement data are similar to one of the derived characteristics.

Optionally, the pre-known current propagation speed in the electrical grid is selected by a user of the system. Alternatively, optionally, the pre-known current propagation speed is measured to check the value of the pre-known current propagation speed. Herein, measurement data received from a plurality of sensing apparatuses is utilised to measure the pre-known current propagation speed, optionally by a fourth processor which is configured to calculate the pre-known current propagation speed from the time instant of the measurement data, correlating the measurement data sent by the first processor and mapping the time instant network topology information (i.e., information pertaining to the configuration of the electrical overhead lines) to calculate the pre-known current propagation speed in the electrical utility grid, optionally using a stimulus event of known location (such as, a trip-on or a reconnect), at a substation in the electrical grid. Moreover, an approximate electrical overhead line length is calculated by measuring time taken by an electrical current transient to travel from one pole (and thereby, a sensing apparatus) to another, and assuming generic values for the pre-known current propagation speed therein.

Optionally, the at least one sensing apparatus comprises a plurality of sensing apparatuses, and wherein the second location of the current transient at the second time instant is determined based also on at least one of:

a correlation between measurement data received from the plurality of sensing apparatuses, said correlation taking into account at least the pre-known current propagation speed and timing information received from the plurality of sensing apparatuses;

characteristics of samples in the measurement data.

Herein, each sensing apparatus is installed at an electrical pole of the electrical utility grid. Alternatively, optionally, each sensing apparatus is installed on the electrical overhead lines of the electrical utility grid. Herein, each sensing apparatus is optionally installed using current transformer type of sensors. Since the measurement data is being generated by each of the plurality of sensing apparatuses, the measurement data is correlated to determine the second time instant. Optionally, the correlation is performed using a correlation algorithm. Moreover, the characteristics of samples in the measurement data are studied to understand which events and faults are related to a given current transient. This is beneficial since it provides added insight and enables an efficient determination of the second time instant.

A technical benefit of using multiple sensing apparatus and correlating their respective data is that correlation of the data enhances accuracy of the system (mainly for the steps of detection/prediction). Optionally, the at least one second processor is further configured to send, to an electrical utility management system, the second location of the current transient at the second time instant, wherein the electrical utility management system, in operation, performs automatic fault isolation in the electrical utility grid. Herein, the automatic fault isolation is performed by isolating the fault such that it does not cause damage to the entire electrical utility grid. Optionally, using the characteristics of samples in the measurement data as a basis enhances the accuracy of the correlation.

Optionally, when processing the measurement data, the location information, and the timing information, the at least one third processor is configured to:

detect at least one fault precursor event, based at least on the measurement data; and employ at least one of: a statistical algorithm, a machine learning algorithm, to predict when and where the fault is likely to occur in the electrical utility grid, based on the at least one fault precursor event.

The term "fault precursor event" refers to an event which acts as a precursor to a fault. The fault precursor event is implemented as at least one of: a power quality issue (caused by excess harmonics), a rapid load change, an interruption, an induced lighting strike, excessive non-linear switching of power loads causing resonant pulses in the medium voltage network, an asymmetrical load, a partial discharge, a sparking, an arc. For example, a slight irregularity in the current transmitted through the electrical overhead lines. Optionally, the detection of the at least one fault precursor event is based also on at least one of: weather information pertaining to the electrical utility grid, geographical information pertaining to the electrical utility grid, electrical utility grid parameters (for ex. load information). A technical effect of this is that such prediction based on fault precursor events prevents grid failure by timely predicting when and where a fault is likely to happen. Optionally, the at least one second processor is further configured to generate a statistical representation and/or a fault report, based on the measurement data, the location information, and the timing information.

Prediction algorithms implemented as at least one of: the statistical algorithm, the machine learning algorithm are employed to predict when and where the fault is likely to occur in the electrical utility grid. Examples of a prediction algorithm include, but are not limited to, a regression algorithm, a pattern recognition algorithm, a data extrapolation algorithm, a linear regression algorithm, a random forest algorithm, a gradient boost algorithm, a utilization of neural networks algorithm.

Optionally, the at least one third processor is further configured to:

determine at least one maintenance task that is to be performed for the electrical utility grid, based on: the fault that has occurred in the electrical utility grid and/or the fault that is likely to occur in the electrical utility grid; and send a notification to at least one device associated with at least one maintenance entity, wherein the notification is indicative of at least one maintenance task to be performed.

The term "maintenance task" refers to an action that is to be performed for the system for monitoring and managing faults in an electrical utility grid, in order to monitor and manage the faults. Optionally, the at least one maintenance task is predicted further based at least on: a type of the electrical utility grid, the location of the electrical utility grid, weather conditions in a vicinity of the electrical utility grid. Optionally, the at least one maintenance task is at least one of: repairing a fault in the electrical utility grid, repairing a damage in the electrical utility grid which may lead to a fault, general maintenance of checking the condition of the electrical overhead lines, electrical pole or sensing apparatus. For example, the at least one maintenance task may be removal of a fallen tree from the electrical overhead lines. Optionally, for the faults that are likely to occur, when the at least one maintenance task is to be performed is also determined. When the at least one maintenance task is to be performed pertains to at least one of: a time at which the at least one maintenance task is to be performed, a date at which the at least one maintenance task is to be performed, a frequency at which the at least one maintenance task is to be performed. In this regard, the time, the date, and/or the frequency, at which the at least one maintenance task is to be performed may be predicted as a future time instant, a future date, a time interval, a time frequency, and the like. For example, it may be predicted that the general maintenance check for electrical pole number 23456 should be performed every 8 weeks.

Optionally, the at least one maintenance entity is at least one of: a maintenance person, a maintenance vehicle, a maintenance robot, a maintenance drone, a maintenance company. Optionally, the at least one third processor is further configured to send the notification at the device associated with at least one of: a maintenance person, a maintenance robot, a maintenance drone, wherein the notification pertains to the at least one maintenance task to be performed. In operation, the notification is provided at the device prior to the predicted instance of when the at least one maintenance task is to be performed. The notification has information pertaining to a given maintenance task to be performed. The notification includes at least one of: a maintenance task to be performed, a type of maintenance task to be performed, when the maintenance task is to be performed, a location at which the maintenance task is to be performed, a product number for which the maintenance task is to be performed. For example, the notification may alert a technical support executive to check on irregular voltages in Oklahoma. Optionally, the notification is indicative also of: a manner in which the at least one maintenance task is to be performed, when the at least one maintenance task is to be performed, and the like.

A technical effect of this is that the second processor determines which task is to be performed based on the occurrence of fault/prediction of fault, where the task is to be performed, and when it is to be performed and sends a requisite notification to a maintenance entity, which saves time and is efficient in managing resources.

The present disclosure also relates to the method for monitoring and managing events and faults in an electrical utility grid as described above. Various embodiments and variants disclosed above, with respect to the aforementioned first aspect, second aspect and third aspect, apply mutatis mutandis to the method.

Optionally, the method further comprises receiving from a geolocation device of the at least one sensing apparatus, location information of the sensing apparatus and timing information of the measurement data.

Optionally, when processing the measurement data, the method further comprises:

detecting a current transient, based on the measurement data, wherein the current transient indicates that the event or fault has occurred in the electrical utility grid;

determining a first location and a first time instant at which the current transient occurs, based on the location information and the timing information, respectively; and determining a second location of the current transient at a second time instant, based on at least on the first location, the first time instant, and a pre-known current propagation speed in the electrical overhead lines, wherein the second time instant is later than the first time instant.

Optionally, when the at least one sensing apparatus comprises a plurality of sensing apparatuses, the second location of the current transient at the second time instant is determined based also on at least one of:

a correlation between measurement data received from the plurality of sensing apparatuses, said correlation taking into account at least the pre-known current propagation speed and timing information received from the plurality of sensing apparatuses;

characteristics of samples in the measurement data.

Optionally, when processing the measurement data, the location information, and the timing information, the method further comprises:

detecting at least one fault precursor event, based at least on the measurement data; and employing at least one of: a statistical algorithm, a machine learning algorithm, to predict when and where the fault is likely to occur in the electrical utility grid, based on the at least one fault precursor event.

Optionally, the method further comprises:

determining at least one maintenance task that is to be performed for the electrical utility grid, based on the fault that has occurred in the electrical utility grid and/or the fault that is likely to occur in the electrical utility grid; and sending a notification to at least one device associated with at least one maintenance entity, wherein the notification is indicative of at least the at least one maintenance task to be performed.

EXPERIMENTAL PART

A test simulation for evaluating beneficial sensor device arrangements in the sensing apparatus was performed. It was observed that a single sensor device can only sense presence and magnitude of a magnetic field in a given plane, which did not accurately identify the presence and magnitude of the magnetic field (i.e., the magnetic field density) of the given electrical overhead line. Notably, the value of current flowing through the given electrical overhead line is representative of the magnetic field density of the given electrical overhead line, and vice versa. Since the magnetic field exists in all planes, it was observed that a plurality of sensor devices arranged in different directions accurately sensed the magnetic field density (which could then be easily utilized to determine the value of current flowing through the given electrical overhead line).

Figure 15A:
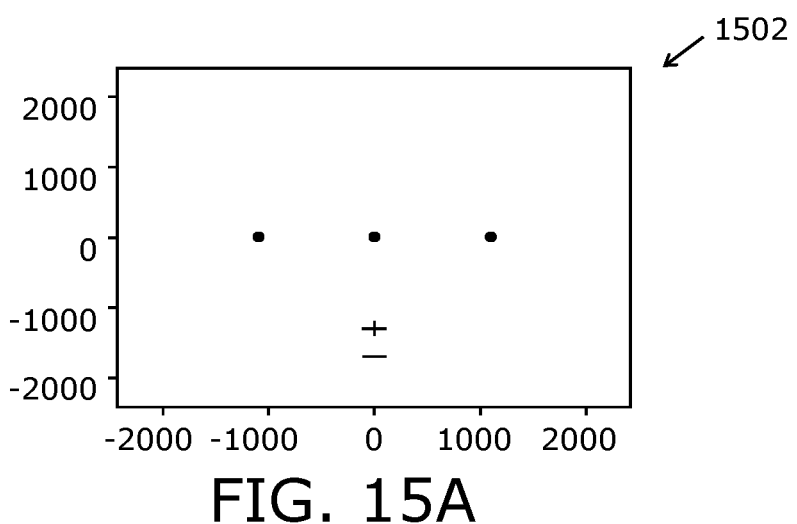
FIGS. 15A-15C are exemplary simulations for a configuration of the sensing apparatus with respect to electrical overhead lines, in accordance with yet another embodiment of the present disclosure.

Moreover, it was observed that having two sensor devices overlap each other to form the cross-positioned two-sensor configuration was extremely beneficial since the magnetic fields did not overlap (i.e., since the sensor devices are positioned to be in different directions), such that precise values of the magnetic field are sensed. An exemplary sensor arrangement is shown in FIG. 15A, with representative sensor signals shown in FIG. 15B and calculated phase currents shown in FIG. 15C. It can be clearly observed how such sensor arrangement beneficially measures the phase currents of the electrical overhead lines.

Furthermore, it was observed that arranging the sensing apparatus with respect to the configuration of the electrical overhead lines beneficially enables the sensor devices to detect events of the electrical overhead lines with improved precision. Two exemplary arrangements of the sensor device with respect to the configuration of the electrical overhead lines are shown in FIGS. 4A and 4B. Moreover, it was observed that a number of sensor devices used in a given sensing apparatus when chosen in congruence with a number of electrical overhead lines (generally, there are three electrical overhead lines, so a three-sensor device arrangement provides precise results, however, in some areas there are four electrical overhead lines as well).

DETAILED DESCRIPTION OF THE DRAWINGS

Referring to FIG. 1, illustrated is a block diagram of an architecture of a sensing apparatus 100, in accordance with an embodiment of the present disclosure. The sensing apparatus 100 comprises a first sensor device 102, a second sensor device 104, and a third sensor device 106. The sensing apparatus 100 further comprises a first processor 108. The first processor 108 is communicably coupled to the first sensor device 102, the second sensor device 104, and the third sensor device 106. Moreover, a second processor 110 and a third processor 112 are communicably coupled to the first processor 108.

Figures 2A, 2B:
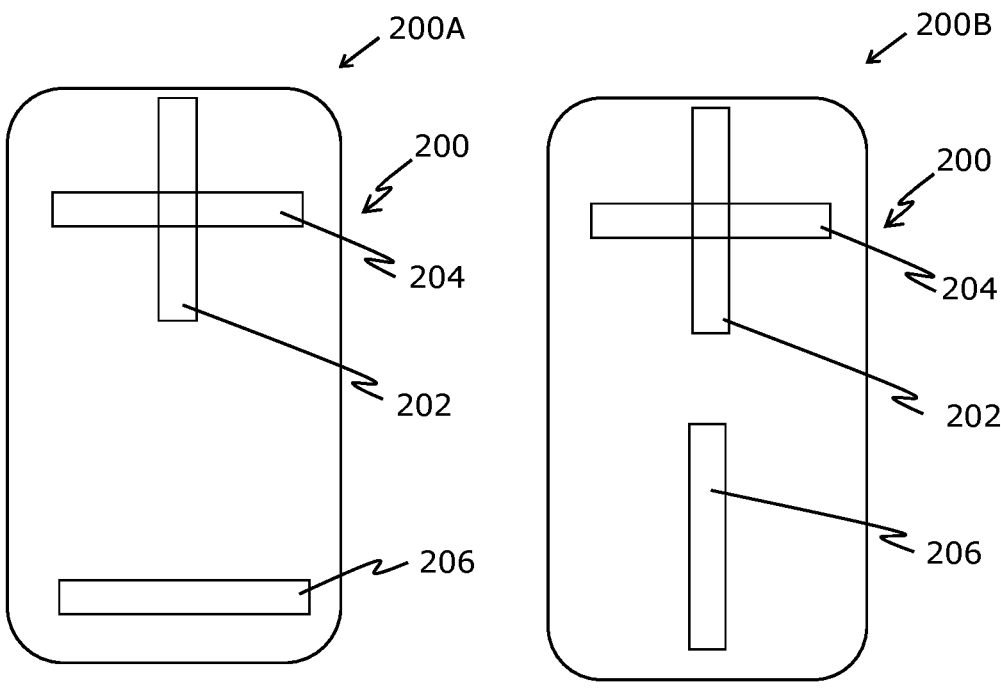
FIGS. 2A-2D illustrate arrangements of sensor devices in a sensing apparatus, in accordance with different embodiments of the present disclosure.

Referring to FIGS. 2A and 2B, illustrated are arrangements of sensor devices 202, 204, 206 in a sensing apparatus 200, in accordance with different embodiments of the present disclosure. The sensing apparatus 200 comprises a first sensor device 202, a second sensor device 204, and a third sensor device 206. The sensor devices 202, 204, 206, in operation, sense magnetic field in close proximity to electrical overhead lines of an electrical utility grid to generate sensor data. The second sensor device 204 overlaps with the first sensor device 202 to form a cross-positioned two-sensor configuration. The third sensor device 206 is arranged at a distance from the cross-positioned two-sensor configuration.

Referring to FIG. 2A, illustrated is an arrangement 200A of sensor devices in a sensing apparatus 200, in accordance with an embodiment of the present disclosure. Herein, the third sensor device 206 is arranged horizontally with respect to the cross-positioned two-sensor configuration.

Referring to FIG. 2B, illustrated is an arrangement 200B of sensor devices in a sensing apparatus 200, in accordance with another embodiment of the present disclosure. Herein, the third sensor 206 is arranged vertically with respect to the cross-positioned two-sensor configuration.

Figures 2C, 2D:
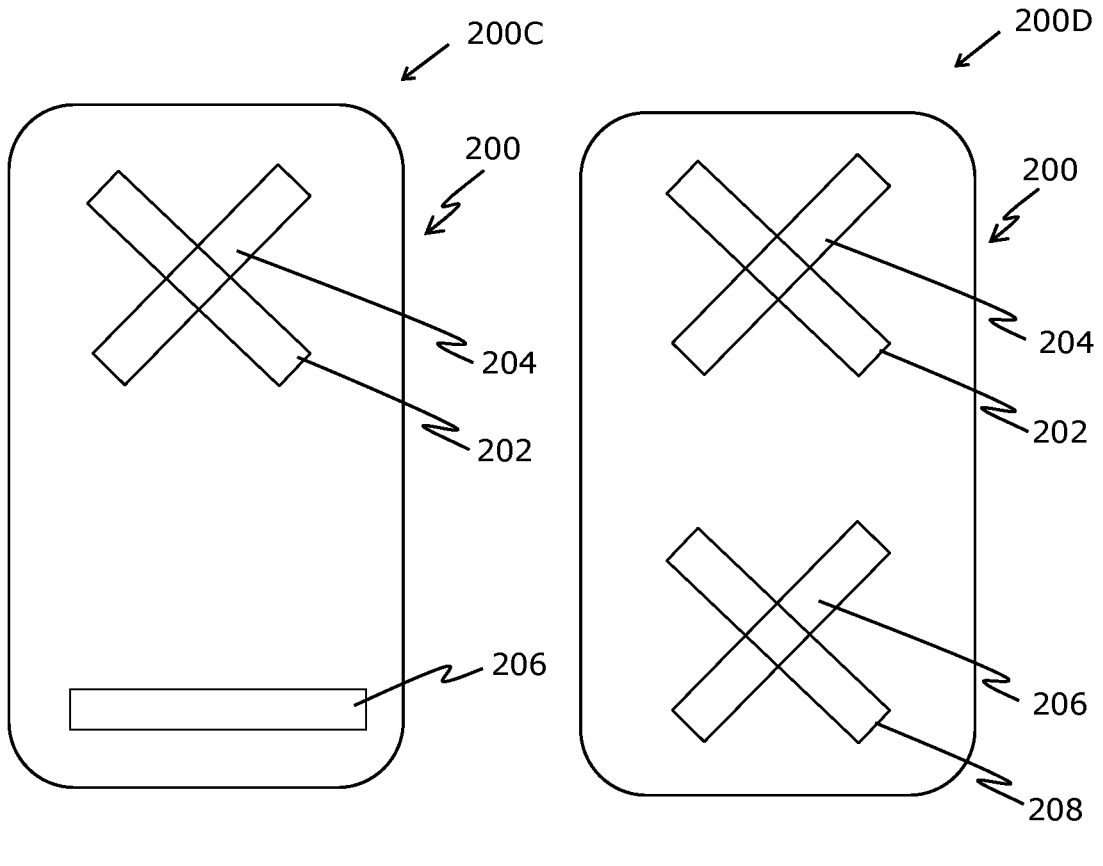

Referring to FIG. 2C, illustrated is an arrangement 200C of sensor devices in a sensing apparatus 200, in accordance with another embodiment of the present disclosure. Herein, the cross-positioned two-sensor configuration formed by the first sensor device 202 and the first sensor device 204 is in shape of "X". Moreover, the third sensor device 206 is arranged horizontally with respect to the cross-positioned two-sensor configuration.

Referring to FIG. 2D, illustrated is an arrangement 200D of sensor devices in a sensing apparatus 200, in accordance with another embodiment of the present disclosure. The sensing apparatus 200 further comprises a fourth sensor device 208. Herein, the cross-positioned two-sensor con-figuration formed by the first sensor device 202 and the first sensor device 204 is in shape of "X". Moreover, the fourth sensor device 208 overlaps with the third sensor device 206 to form another cross-positioned two-sensor configuration in shape of "X".

Referring to FIGS. 3A and 3B, illustrated are exemplary schematic illustrations of a housing of a sensing apparatus 300, in accordance with different embodiments of the pres-ent disclosure.

FIG. 3A is an exemplary schematic illustration of an integrated housing 300A of a sensing apparatus 300, in accordance with an embodiment of the present disclosure. Herein, components of the sensing apparatus 300, including at least a first sensor device 302, a second sensor device 304, and a third sensor device 306 are arranged in the same housing, as shown in the figure.

FIG. 3B is an exemplary schematic illustration of a distributed housing 300B of a sensing apparatus 300, in accordance with another embodiment of the present disclo-sure. Herein, components of the sensing apparatus 300 are divided and arranged in multiple distributed housing, as shown in the figure.

FIGS. 4A and 4B illustrate arrangements of a sensing apparatus 400 with respect to an electrical pole 414, in accordance with different embodiments of the present dis-closure. The sensing apparatus 400 comprises a first sensor device 402, a second sensor device 404, and a third sensor device 406. Based on the configuration of the sensing apparatus 400 with respect to the electrical pole 414, a configuration of electrical overhead lines 408, 410 and 412, also differs.

FIG. 4A illustrates a vertical arrangement of the sensing apparatus 400 with respect to the electrical pole 414. Herein, the electrical overhead lines 408, 410 and 412 are configured horizontally with respect to the electrical pole 414, as shown in the figure.

FIG. 4B illustrates a horizontal arrangement of the sens-ing apparatus 400 with respect to the electrical pole 414. Herein, the electrical overhead lines 408, 410 and 412 are configured vertically with respect to the electrical pole 414, as shown in the figure.

Figure 5:
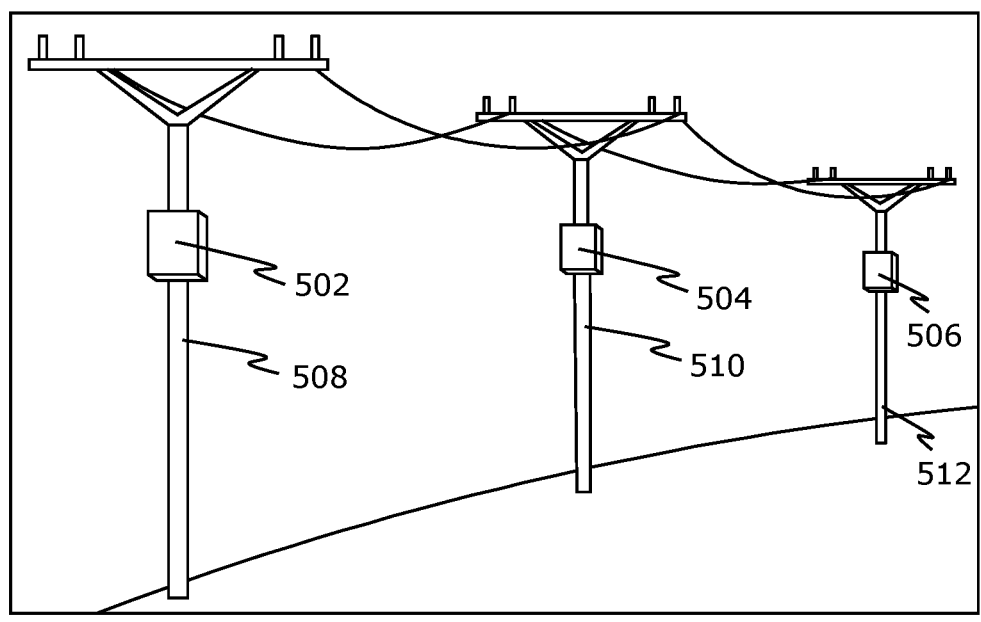
FIG. 5 is an exemplary schematic illustration of sensing apparatuses with respect to electrical poles of an electrical utility grid, in accordance with an embodiment of the present disclosure.

Referring to FIG. 5, illustrated is an exemplary schematic illustration of sensing apparatuses 502, 504, 506 with respect to electrical poles 508, 510, 512 of an electrical utility grid, in accordance with an embodiment of the present disclosure. The sensing apparatuses 502, 504, 506 comprise sensor devices, which, in operation, sense magnetic field in close proximity to electrical overhead lines of an electrical utility grid to generate sensor data. Herein, at least a portion of the sensing apparatuses 502, 504, 506 is arranged on an electrical pole 508, 510, 512 of the electrical utility grid. As shown in the figure, the sensing apparatus 502 is arranged on the electrical pole 508, the sensing apparatus 504 is arranged on the electrical pole 510 and the sensing apparatus 506 is arranged on the electrical pole 512.

It may be understood by a person skilled in the art that the FIGS. 1, 2A, 2B, 3A, 3B, 4A, 4B and 5 are merely examples for sake of clarity, which should not unduly limit the scope of the claims herein. The person skilled in the art will recognize many variations, alternatives, and modifications of embodiments of the present disclosure.

FIG. 6 is an exemplary illustration of a measurement configuration 600 of a sensing apparatus 602, in accordance with an embodiment of the present disclosure. The sensing apparatus 602 comprises a first sensor device 604, and a second sensor device 606. The second sensor device 606 overlaps with the first sensor device 604 to form a cross-positioned two-sensor configuration as shown in the figure. Herein, at least a portion of the sensing apparatus 602 is arranged on an electrical pole of an electrical utility grid. The sensor devices 604, 606, in operation, sense magnetic field with directional gain illustrated as 608$a$, 608$b$, 610$a$, 610$b$ to an electrical overhead line 612 of an electrical utility grid to generate sensor data. The sensor device 604 senses magnetic field in close proximity areas 608$a$, and 608$b$, and the sensor device 606 senses magnetic field in close prox-imity areas 610$a$, and 610$b$. Depending on distances $L_x$, $L_y$, $L_{xy}$ between the electrical overhead line 612 and the sensor devices 604, 606, and with directional gain illustrated as 608$a$, 608$b$, 610$a$, 610$b$, directional gains of the sensor devices 604, 606 are calculated for generating the sensor data.

Figure 7A:
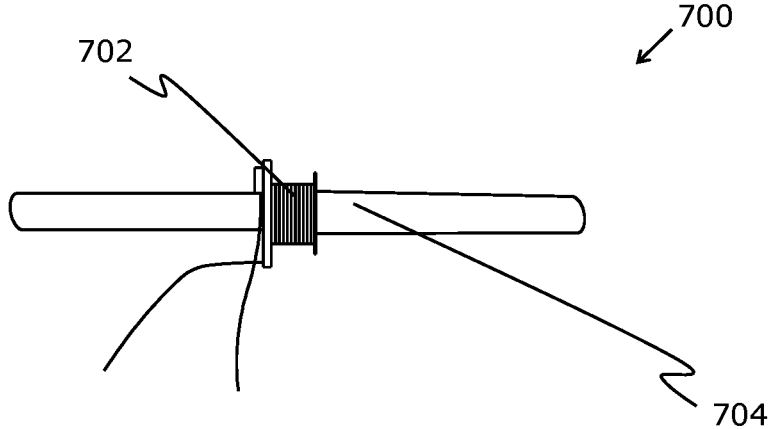
FIGS. 7A and 7B are exemplary illustrations of a magnetic field sensor, in accordance with an embodiment of the present disclosure.
Figure 7B:
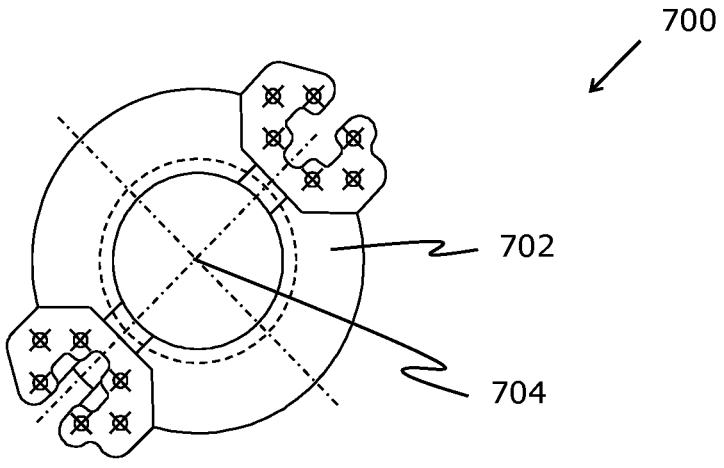

FIGS. 7A and 7B are exemplary illustrations of a mag-netic field sensor 700, in accordance with an embodiment of the present disclosure. The magnetic field sensor 700 is implemented as a coil 702 wound around a ferrite core 704. FIG. 7A is an exemplary schematic illustration of a magnetic field sensor 700, in accordance with an embodiment of the present disclosure. FIG. 7B is a side profile of a magnetic field sensor 700, in accordance with an embodiment of the present disclosure.

It may be understood by a person skilled in the art that the FIGS. 6, 7A, and 7B are merely examples for sake of clarity, which should not unduly limit the scope of the claims herein. The person skilled in the art will recognize many variations, alternatives, and modifications of embodiments of the pres-ent disclosure.

Figure 8B:
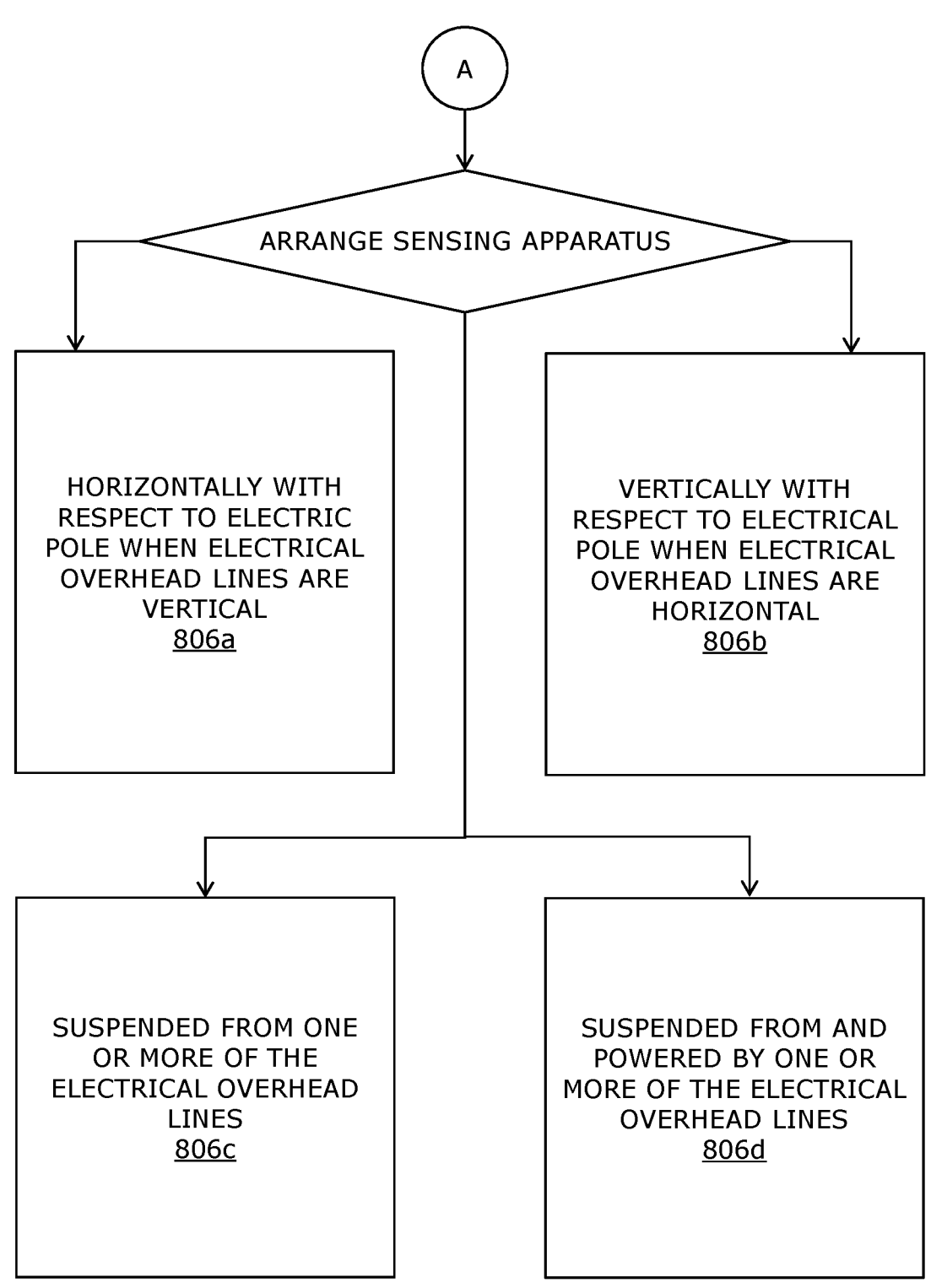
FIG. 8 illustrates steps of a method for installing a sensing apparatus in an electrical utility grid, in accordance with an embodiment of the present disclosure.

Referring to FIG. 8, illustrated are steps of a method for installing a sensing apparatus in an electrical utility grid, in accordance with an embodiment of the present disclosure. At step 802, at least a first sensor device, a second sensor device, a third sensor device, and a first processor of the sensing apparatus are arranged in a housing such that when the housing is arranged on an electrical pole, the second sensor device overlaps with the first sensor device to form a cross-positioned two-sensor configuration, and the third sensor device is arranged at a distance from the cross-positioned two-sensor configuration. At step 804, informa-tion regarding a configuration of electrical overhead lines with respect to the electrical pole is obtained. Furthermore, the sensing apparatus is arranged based on the configuration of the electrical overhead lines, such that:

at step 806$a$, the sensing apparatus is arranged horizon-tally with respect to the electrical pole, when the configuration of the electrical overhead lines with respect to the electrical pole is a vertical configuration at step 806b, the sensing apparatus is arranged vertically with respect to the electrical pole, when the configuration of the electrical overhead lines with respect to the electrical pole is a horizontal configuration;

at step 806c, the sensing apparatus is arranged to be suspended from one or more of the electrical overhead lines; or at step 806d, the sensing apparatus is arranged to be suspended from one or more of the electrical overhead lines, such that the sensing apparatus is powered by the electrical overhead lines.

The steps 802 to 806 are only illustrative and other alternatives can also be provided where one or more steps are added, one or more steps are removed, or one or more steps are provided in a different sequence without departing from the scope of the claims herein.

Figure 9:
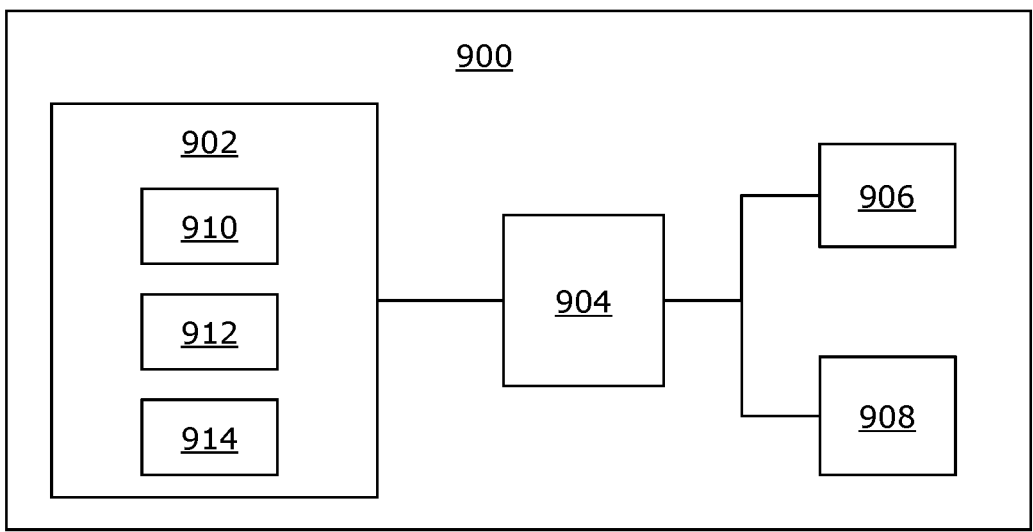
FIG. 9 illustrates an architecture of a system for monitoring and managing events and faults in an electrical utility grid, in accordance with an embodiment of the present disclosure.

Referring to FIG. 9, illustrated is an architecture of a system 900 for monitoring and managing events and faults in an electrical utility grid, in accordance with an embodiment of the present disclosure. The system 900 comprises a sensing apparatus 902, a first processor 904, a second processor 906, and a third processor 908. The sensing apparatus 902 comprises a first sensor device 910, a second sensor device 912, and a third sensor device 914. The sensing apparatus 902 is communicably coupled to the first processor 904. The first processor 904 is communicably coupled to the second processor 906 and the third processor 908.

Figure 10:
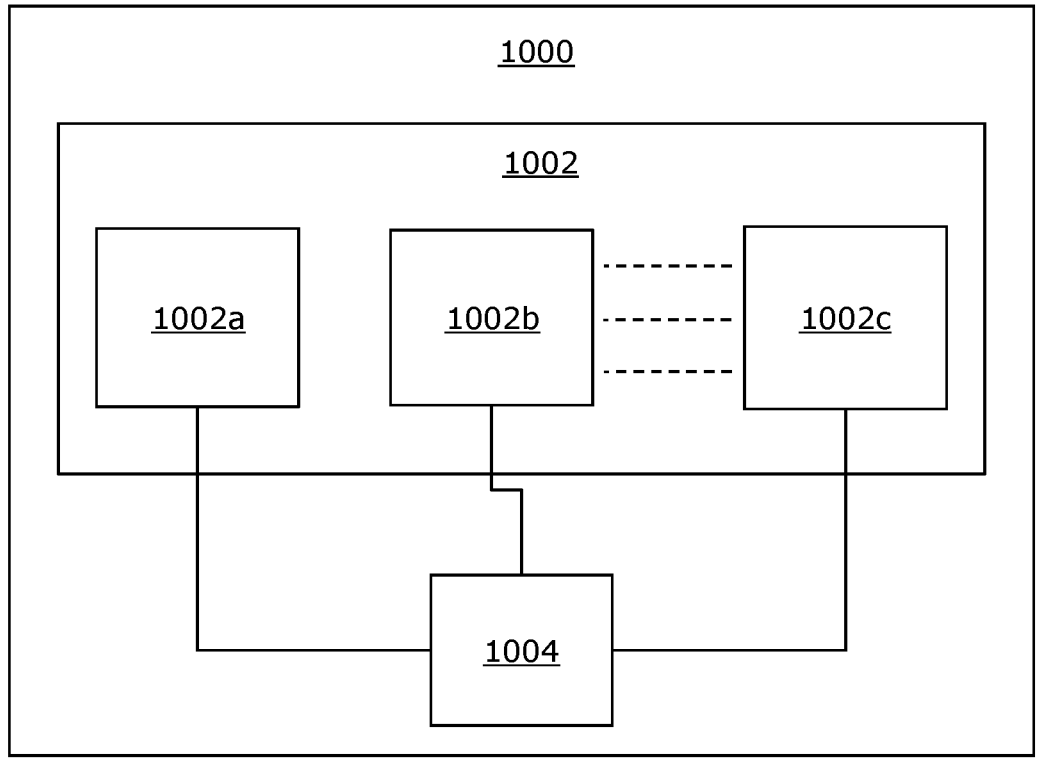
FIG. 10 illustrates an architecture of a system for monitoring and managing events and faults in an electrical utility grid, in accordance with another embodiment of the present disclosure.

Referring to FIG. 10, illustrated is an architecture of a system 1000 for monitoring and managing events and faults in an electrical utility grid, in accordance with another embodiment of the present disclosure. The system 1000 comprises a sensing apparatus 1002 and a third processor 1004. The sensing apparatus 1002 comprises a plurality of sensing apparatuses 1002a, 1002b, 1002c.

Figure 11A:
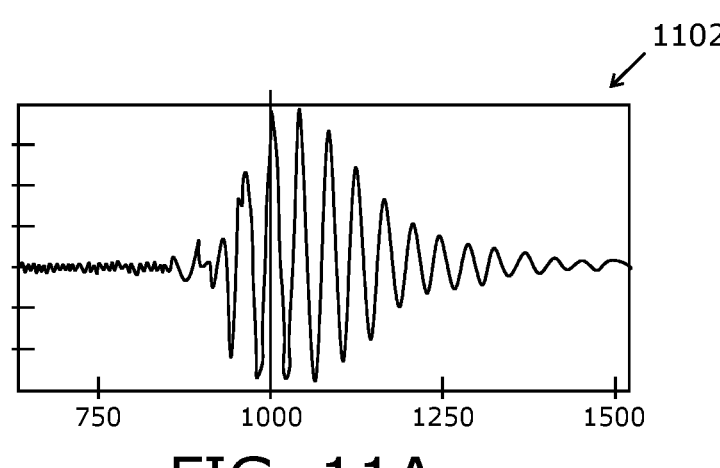
FIGS. 11A-11C illustrate different waveforms of current transients, in accordance with various embodiments of the present disclosure.
Figure 11B:
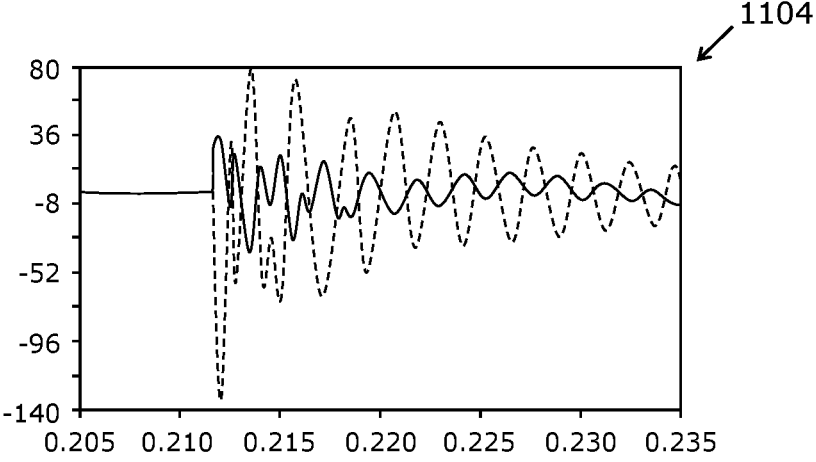
Figure 11C:
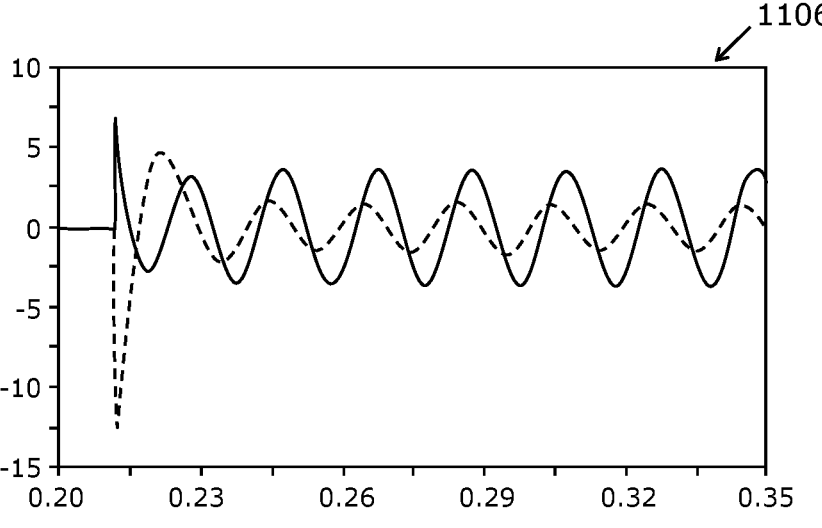

Referring to FIGS. 11A-11C, illustrated are different waveforms 1102, 1104, 1106 of current transients, in accordance with various embodiments of the present disclosure. FIG. 11A is a waveform 1102 of a load induced current transient. FIG. 11B is a waveform 1104 of a simulated current transient for a low impedance fault. FIG. 11C is a waveform 1106 of a simulated current transient for a high impedance fault.

It may be understood by a person skilled in the art that the FIGS. 9, 10, and 11 are merely examples for sake of clarity, which should not unduly limit the scope of the claims herein. The person skilled in the art will recognize many variations, alternatives, and modifications of embodiments of the present disclosure.

Referring to FIG. 12, illustrated are steps of a method for monitoring and managing events and faults in an electrical utility grid, in accordance with an embodiment of the present disclosure. At step 1202, using at least a first sensor device, a second sensor device and a third sensor device of at least one sensing apparatus, magnetic field in close proximity to electrical overhead lines of the electrical utility grid is sensed for generating sensor data. At step 1204, the sensor data is processed for generating measurement data, the measurement data comprising values of currents flowing through the electrical overhead lines. At step 1206, the measurement data is received from the at least one sensing apparatus. At step 1208, the measurement data and the measurement data are processed to reproduce line phase currents. At step 1210, the measurement data is processed for detecting and locating an event or a fault that has occurred in the electrical utility grid and/or predicting when and where an event or a fault is likely to occur in the electrical utility grid.

The steps 1202 to 1208 are only illustrative and other alternatives can also be provided where one or more steps are added, one or more steps are removed, or one or more steps are provided in a different sequence without departing from the scope of the claims herein.

Figure 13A:
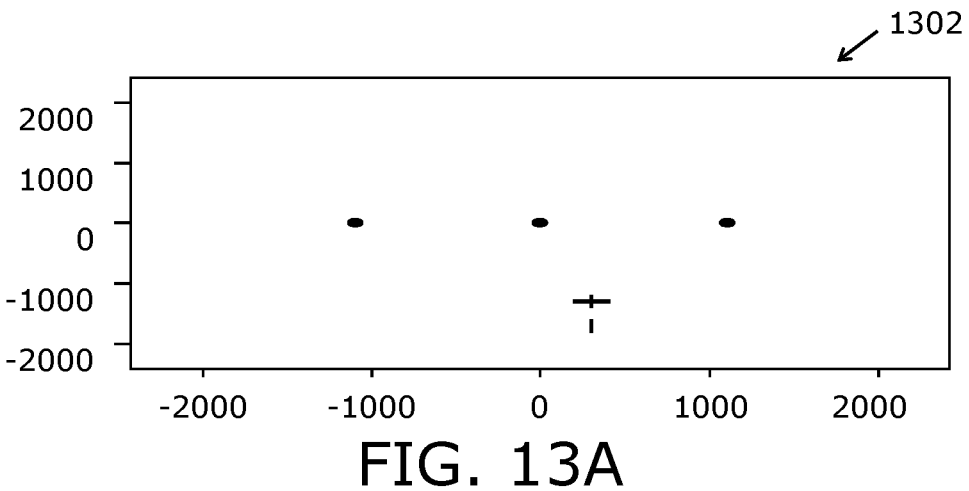
FIGS. 13A-13C are exemplary simulations for a configuration of the sensing apparatus with respect to electrical overhead lines, in accordance with an embodiment of the present disclosure.
Figure 13B:
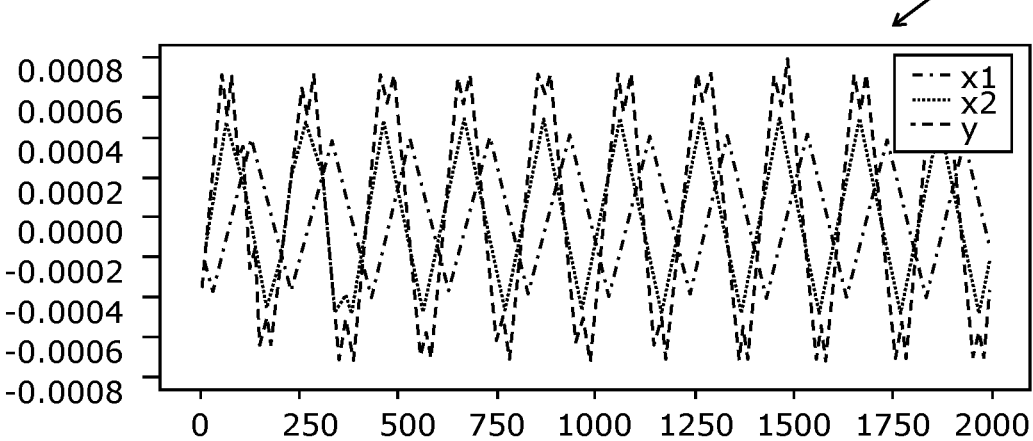
Figure 13C:
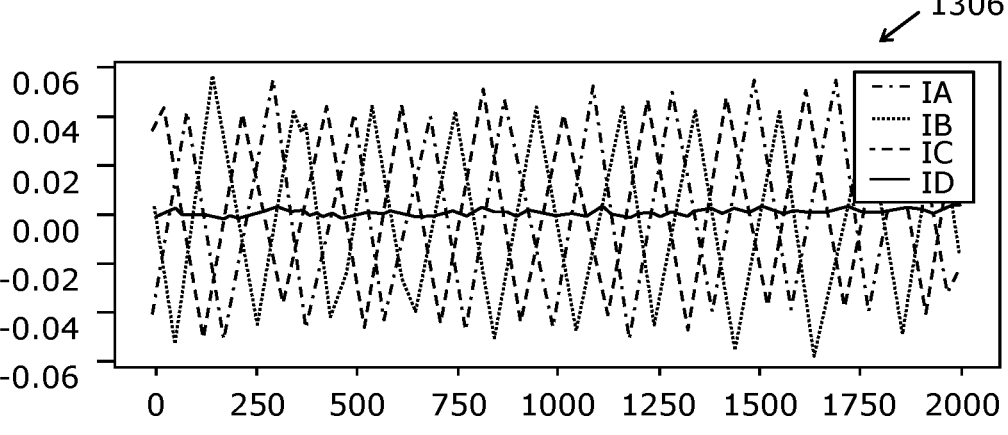

Referring to FIGS. 13A-13C, illustrated are exemplary simulations 1302, 1304, 1306 for a configuration of the sensing apparatus with respect to electrical overhead lines, in accordance with an embodiment of the present disclosure. FIG. 13A is an exemplary simulation 1302 of a line horizontal sensor having a top shift of 300 units and a turn of 90 units. FIG. 13B is an exemplary simulation 1304 of a sampled waveform for the configuration of the sensing apparatus with respect to electrical overhead lines shown in FIG. 13A. FIG. 13C is an exemplary simulation 1306 of a resolved waveform for the configuration of the sensing apparatus with respect to electrical overhead lines shown in FIG. 13A.

Figure 14A:
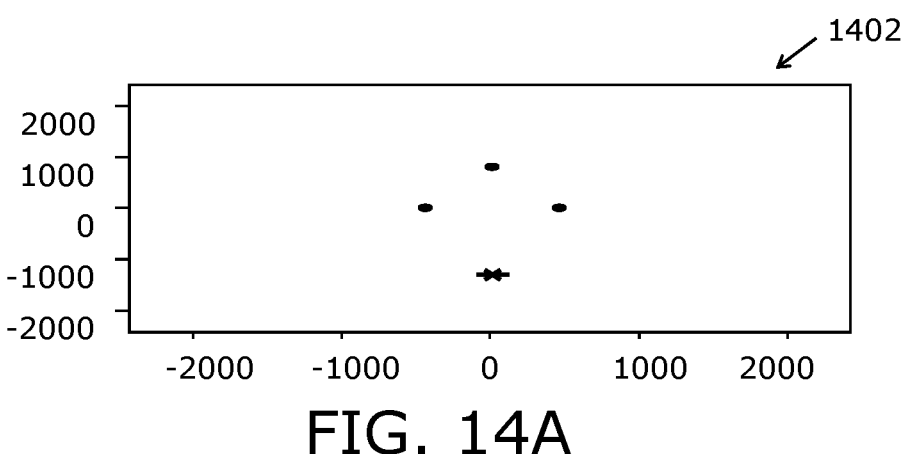
FIGS. 14A-14C are exemplary simulations for a configuration of the sensing apparatus with respect to electrical overhead lines, in accordance with another embodiment of the present disclosure.
Figure 14B:
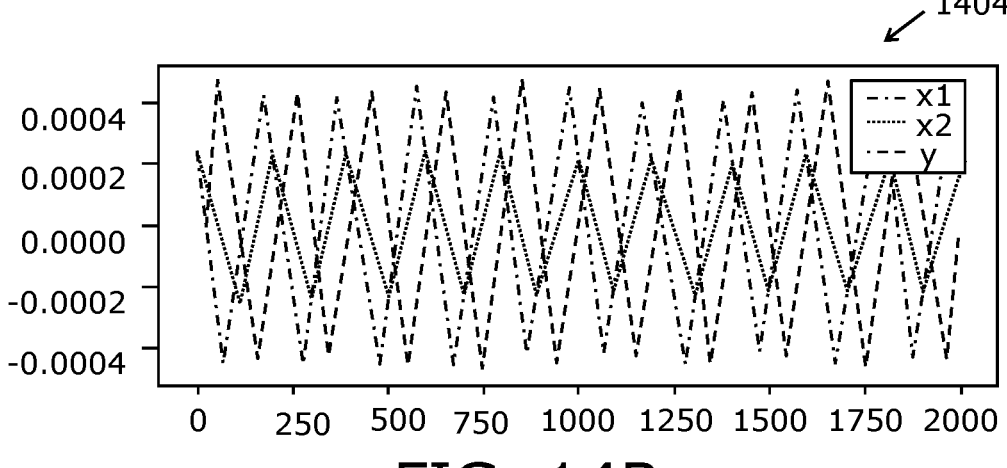
Figure 14C:
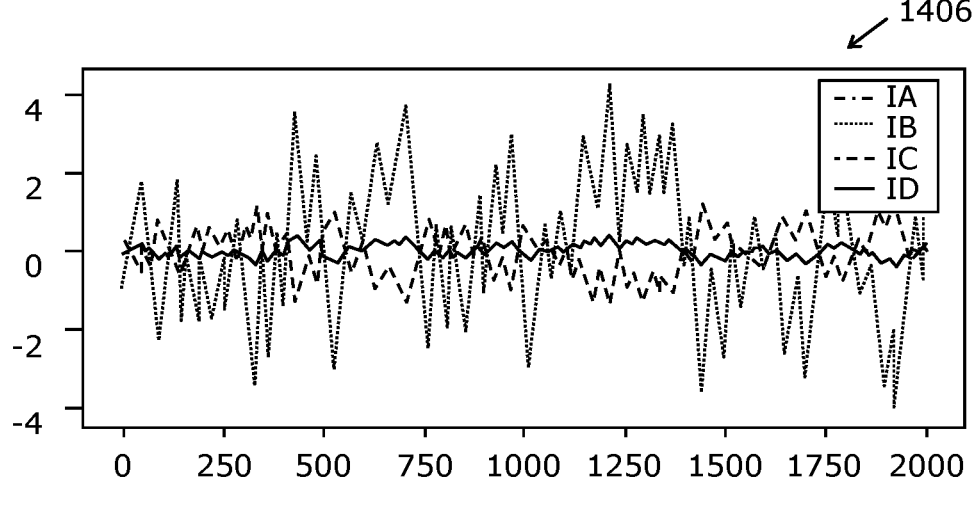

Referring to FIGS. 14A-14C, illustrated are exemplary simulations 1402, 1404, 1406 for a configuration of the sensing apparatus with respect to electrical overhead lines, in accordance with another embodiment of the present disclosure. FIG. 14A is an exemplary simulation 1402 of a line triangle sensor having a star 60 shift of 0 units and a turn of 0 units. FIG. 14B is an exemplary simulation 1404 of a sampled waveform for the configuration of the sensing apparatus with respect to electrical overhead lines shown in FIG. 14A. FIG. 14C is an exemplary simulation 1406 of a resolved waveform for the configuration of the sensing apparatus with respect to electrical overhead lines shown in FIG. 14A.

Figure 15B:
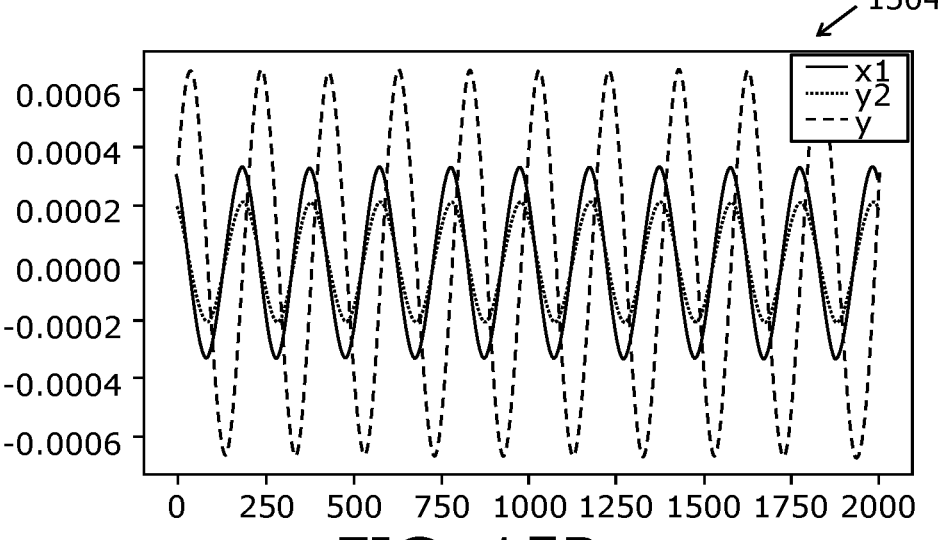
Figure 15C:
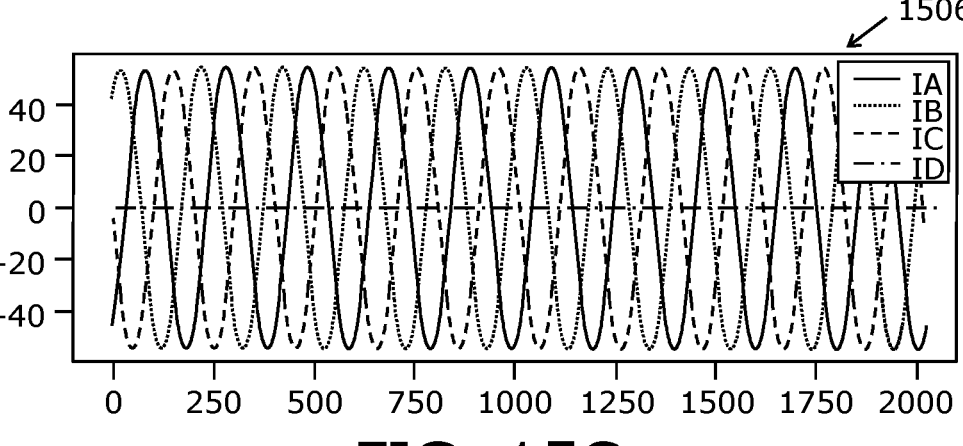

Referring to FIGS. 15A-15C, illustrated are exemplary simulations 1502, 1504, 1506 for a configuration of the sensing apparatus with respect to electrical overhead lines, in accordance with another embodiment of the present disclosure. FIG. 15A is an exemplary simulation 1502 of a line horizontal sensor having a top shift of 0 units and a turn of 0 units. FIG. 15B is an exemplary simulation 1504 of a sampled waveform for the configuration of the sensing apparatus with respect to electrical overhead lines shown in FIG. 15A. Herein, the sampled waveform represents sensor signals captured by the sensing apparatus. FIG. 15C is an exemplary simulation 1506 of a resolved waveform for the configuration of the sensing apparatus with respect to electrical overhead lines shown in FIG. 15A. Herein, the resolved waveform represents phase currents calculated from the sensor signals using an example of a matrix form.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A sensing apparatus comprising:

at least a first sensor device, a second sensor device, and a third sensor device that, in operation, sense magnetic field in close proximity to electrical overhead lines of an electrical utility grid to generate sensor data, wherein at least a portion of the sensing apparatus is arranged on an electrical pole, of the electrical utility grid, and wherein the second sensor device overlaps with the first sensor device to form a cross-positioned two-sensor configuration; and the third sensor device is arranged at a distance from the cross-positioned two-sensor configuration; and a first processor configured to:

pre-process the sensor data and send the sensor data to a second processor;

generate measurement data, the measurement data comprising values of magnetic field produced by electrical currents flowing through the electrical overhead lines; and send, to at least one second processor, the measurement data and the sensor data, for reproducing overhead line phase currents, wherein the second processor is configured to send, to at least one third processor, the measurement data, wherein the at least one third processor, in operation, utilizes the measurement data, for monitoring and managing currents, events and faults in the electrical utility grid.

2. The sensing apparatus according to claim 1, wherein the arrangement of the sensing apparatus depends on a configuration of the electrical overhead lines with respect to the electrical pole, such that:

when the configuration of the electrical overhead lines with respect to the electrical pole is a horizontal configuration, the sensing apparatus is arranged vertically with respect to the electrical pole; and when the configuration of the electrical overhead lines with respect to the electrical pole is a vertical configuration, the sensing apparatus is arranged horizontally with respect to the electrical pole, and/or shifted horizontally from the electrical pole.

3. The sensing apparatus according to claim 1, wherein the sensing apparatus is arranged to be suspended from one or more of the electrical overhead lines.

4. The sensing apparatus according to claim 3, wherein the sensing apparatus is powered by the electrical overhead lines.

5. The sensing apparatus according to claim 1, wherein a shortest distance between the sensing apparatus and the electrical overhead lines lies in a range of 500 millimetres-2000 millimetres for distribution networks.

6. The sensing apparatus according to claim 1, wherein a shortest distance between the sensing apparatus and the electrical overhead lines lies in a range of 1000 millimetres-10 000 millimetres for transmission networks.

7. The sensing apparatus according to claim 1, wherein the sensing apparatus is enclosed in a housing, and wherein the housing is implemented as one of: an integrated housing, a distributed housing.

8. The sensing apparatus according to claim 7, wherein when the housing is the distributed housing, the first sensor device, the second sensor device and the third sensor device are arranged in proximity to the electrical pole.

9. The sensing apparatus according to claim 1, wherein a given sensor device comprises:

a magnetic field sensor; and a measurement apparatus arranged in a circuit including the magnetic field sensor, wherein the measurement apparatus, in operation, measures an induced current in the circuit, the sensor data comprising values of the induced current in the circuit, wherein when processing the sensor data to generate the measurement data, the first processor is configured to:

determine values of magnetic field densities produced by electrical current in the electrical overhead lines; and determine the values of currents flowing through the electrical overhead lines, based on the values of the magnetic field densities measured by the sensors and the directivity and orientation of the sensors and distance and position of the electrical overhead lines from the sensors.

10. A method for installing a sensing apparatus in an electrical utility grid, comprising:

arranging at least a first sensor device, a second sensor device, a third sensor device, and a first processor of the sensing apparatus in a housing such that when the housing is arranged on an electrical pole;

the second sensor device overlaps with the first sensor device to form a cross-positioned two-sensor configuration, and the third sensor device is arranged at a distance from the cross-positioned two-sensor configuration;

obtaining information regarding a configuration of electrical overhead lines with respect to the electrical pole; and arranging the sensing apparatus based on the configuration of the electrical overhead lines, such that:

the sensing apparatus is arranged horizontally with respect to the electrical pole, when the configuration of the electrical overhead lines with respect to the electrical pole is a vertical configuration;

the sensing apparatus is arranged vertically with respect to the electrical pole, when the configuration of the electrical overhead lines with respect to the electrical pole is a horizontal configuration;

the sensing apparatus is arranged to be suspended from one or more of the electrical overhead lines; or the sensing apparatus is arranged to be suspended from one or more of the electrical overhead lines, such that the sensing apparatus is powered by the electrical overhead lines.

11. The method according to claim 10, wherein the sensing apparatus is installed between the electrical overhead lines and a surface upon which the electrical pole is installed, wherein a shortest distance between the sensing apparatus and the electrical overhead lines lies in a range of 1500 millimetres-10000 millimetres for transmission networks.

12. A system for monitoring and managing events and faults in an electrical utility grid, the system comprising:

at least one sensing apparatus comprising:

at least a first sensor device, a second sensor device, and a third sensor device that, in operation, sense magnetic field in close proximity to electrical overhead lines of the electrical utility grid to generate sensor data, wherein at least a portion of the sensing apparatus is arranged on an electrical pole of the electrical utility grid, and wherein the second sensor device overlaps with the first sensor device to form a cross-positioned two-sensor configuration; and the third sensor device is arranged at a distance from the cross-positioned two-sensor configuration; and a first processor configured to pre-process the sensor data and send the sensor data to a second processor, generate measurement data, the measurement data comprising values of currents flowing through the electrical overhead lines;

at least one second processor communicably coupled to the first processor, wherein the at least one second processor is configured to:

receive, from the first processor, the sensor data pre-processed by the first processor, and the measurement data; and process the measurement data and the sensor data to reproduce overhead line phase currents;

at least one third processor communicably coupled to the first processor, wherein the at least third processor is configured to:

receive, from the second processor, the measurement data;

process the measurement data to:

detect, classify and locate an event or a fault that has occurred in the electrical utility grid; and/or predict when and where an event or a fault is likely to occur in the electrical utility grid; and alert a network operator of the detected or predicted event or fault and its location.

13. The system according to claim 12, wherein the sensing apparatus further comprises a geolocation device, wherein the geolocation device provides location information of the sensing apparatus and timing information of the measurement data.

14. The system according to claim 13, wherein when processing the measurement data, the at least one third processor is configured to:

detect a current transient based on the measurement data, wherein the current transient indicates that an event or fault has occurred in the electrical utility grid;

determine a first location and a first time instant at which the current transient occurs, based on the location information and the timing information, respectively; and determine a second location of the current transient at a second time instant, based on at least on the first location, the first time instant, and a pre-known current propagation speed in the electrical overhead lines, wherein the second time instant is later than the first time instant.

15. A method for monitoring and managing events and faults in an electrical utility grid, the method comprising:

sensing, using at least a first sensor device, a second sensor device and a third sensor device of at least one sensing apparatus, a magnetic field in close proximity to electrical overhead lines of the electrical utility grid for generating sensor data, wherein the the second sensor device overlaps with the first sensor device to form a cross-positioned two-sensor configuration and the third sensor device is arranged at a distance from the cross-positioned two-sensor configuration, the sensing apparatus being at least partially arranged on an electrical pole;

processing, by a first processor of the sensing apparatus, the sensor data and sending the sensor data to a second processor generating, by the first processor, measurement data, the measurement data comprising values of currents flowing through the electrical overhead lines;

receiving, from the at least one sensing apparatus, the measurement data;

processing the measurement data and the sensor data for reproducing overhead line phase currents; and processing the measurement data for one or more of:

detecting and locating an event or a fault that has occurred in the electrical utility grid; and predicting when and where an event or a fault is likely to occur in the electrical utility grid.

* * * * *